United States Patent
Chen et al.

(10) Patent No.: US 11,245,036 B1
(45) Date of Patent: Feb. 8, 2022

(54) LATCH-UP PREVENTION

(71) Applicant: Taiwan Semiconductor Manufacturing Co., Ltd., Hsin-Chu (TW)

(72) Inventors: Shih-Cheng Chen, New Taipei (TW); Kuo-Cheng Chiang, Hsinchu County (TW); Zhi-Chang Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/935,000

(22) Filed: Jul. 21, 2020

(51) Int. Cl.
| | |
|---|---|
| *H01L 21/02* | (2006.01) |
| *H01L 21/8238* | (2006.01) |
| *H01L 27/092* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC .. *H01L 29/78612* (2013.01); *H01L 21/02236* (2013.01); *H01L 21/02532* (2013.01); *H01L 21/02603* (2013.01); *H01L 21/823807* (2013.01); *H01L 21/823814* (2013.01); *H01L 21/823864* (2013.01); *H01L 27/0921* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC .......... H01L 29/78612; H01L 29/0673; H01L 29/42392; H01L 29/66545; H01L 29/66553; H01L 29/66742; H01L 29/78618; H01L 29/78696; H01L 27/0921; H01L 21/02236; H01L 21/02532; H01L 21/02603; H01L 21/823807; H01L 21/823814; H01L 21/823864
USPC ......................................... 257/351
See application file for complete search history.

(56) References Cited

U.S. PATENT DOCUMENTS

| | | | |
|---|---|---|---|
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,325,820 B1* | 6/2019 | Seo | H01L 21/823878 |
| 10,475,902 B2 | 11/2019 | Lee et al. | |
| 2014/0004684 A1* | 1/2014 | Di | H01L 21/76254 438/458 |

(Continued)

*Primary Examiner* — Tong-Ho Kim
(74) *Attorney, Agent, or Firm* — Haynes and Boone, LLP

(57) ABSTRACT

A semiconductor device according to the present disclosure includes an active region including a channel region and a source/drain region adjacent the channel region, a vertical stack of channel members over the channel region, a gate structure over and around the vertical stack of channel members, a bottom dielectric feature over the source/drain region, a source/drain feature over the bottom dielectric feature, and a germanium layer disposed between the bottom dielectric feature and the source/drain region.

20 Claims, 19 Drawing Sheets

(56) References Cited

U.S. PATENT DOCUMENTS

| | | |
|---|---|---|
| 2018/0175036 A1 | 6/2018 | Ching et al. |
| 2020/0168742 A1* | 5/2020 | Wang ................ H01L 21/02603 |
| 2020/0295198 A1* | 9/2020 | Cheng ............... H01L 21/76805 |

* cited by examiner

LATCH-UP PREVENTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked. Such GAA transistor can be referred to as a vertically-stacked horizontal GAA (VGAA) transistor.

Latch-up is failure mechanism of complementary metal oxide semiconductor (CMOS) ICs that are characterized by excessive drain current coupled with device failure or device destruction. Multi-gate devices are not immune to latch-up. A latch-up is largely resulted from parasitic PNP and NPN bipolar transistors due to arrangements of wells and active doping regions in a bulk substrate. CMOS devices fabricated on silicon-on-insulator (SOI) substrate is generally resistant to latch-up because n-wells and p-wells are substantially isolated due to the presence of the embedded silicon oxide isolation layer. Latch-up prevention devices, such as guard rings and tap cells, are routinely incorporated in circuit designs. Tap cells are placed among standard cells and are isolated from the standard cells by one or more isolation structures. The tap cells and the isolation structures may increase the overall size of the integrated circuit. Given a fixed area of an IC chip, the tap cells and the isolation structures may displace the real estate for functional devices. While the conventional structures for tap cells are adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
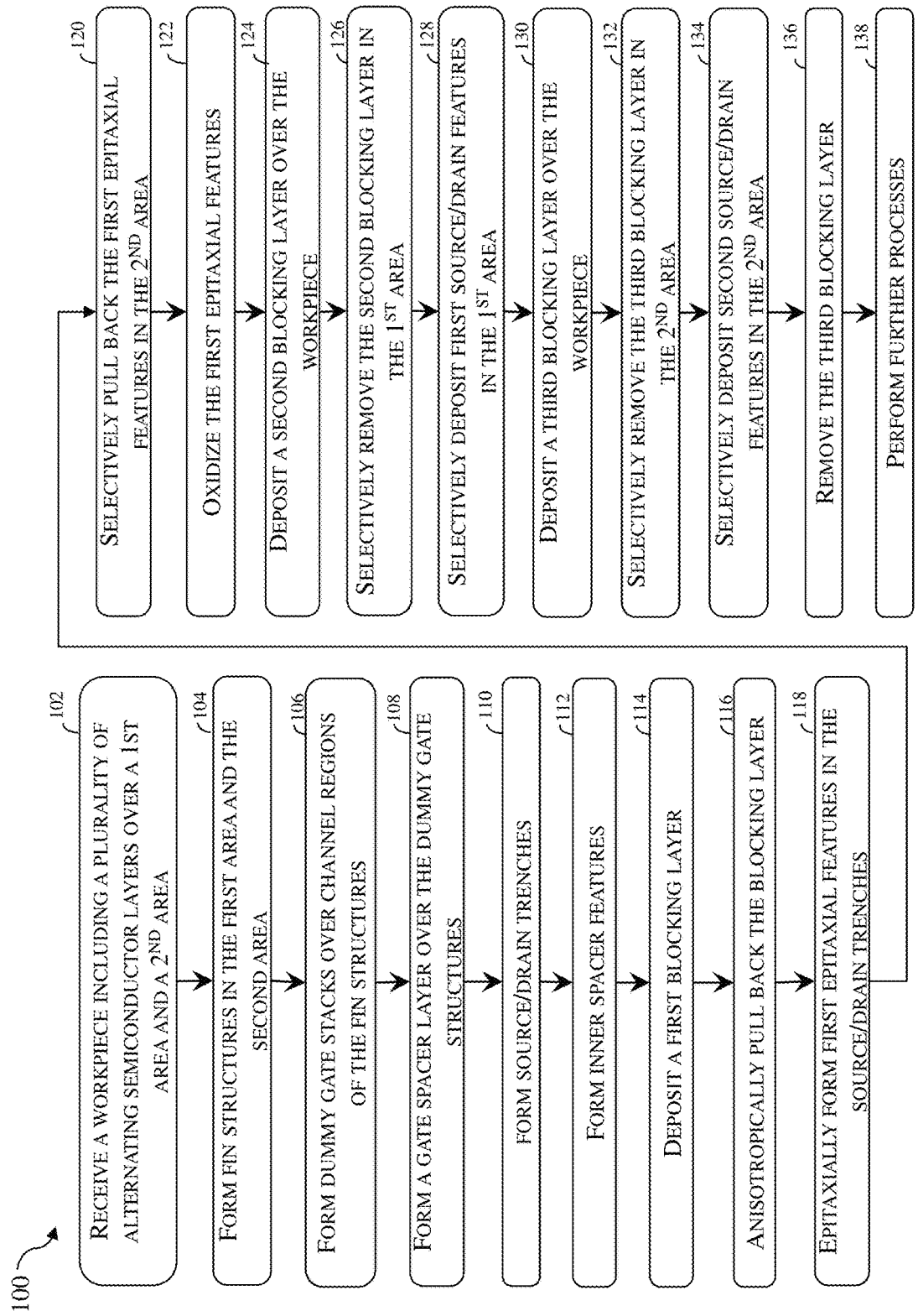
FIG. 1 illustrates a flow chart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

In circuit design, a standard cell is a block of transistors that is repeated according to a set of design rules across a design layout. A standard cell may be used for different functions. For example, a standard cell may be a static random access memory (SRAM) standard cell or a logic cell for logic operations. A standard cell may include one or more p-type transistors and one or more n-type transistors. The transistors may be planar transistors or multi-gate transistors, such as fin-type field effect transistors (FinFETs) or gate-all-around (GAA) transistors. To fabricate transistors on bulk substrates, n-type wells doped with n-type dopants and p-type wells doped with p-type dopants are formed in the bulk substrate and active regions of opposite conductivity types are formed over the respective n-type wells and p-type wells. Accordingly, a p-type transistor includes a p-type active region formed over an n-type well (n-well) and an n-type transistor includes an n-type active region formed over a p-type well (p-well). When an n-type transistor is placed adjacent to a p-type transistor, a parasitic PNP bipolar transistor may be formed among a p-type active region, the n-type well underlying the p-type active region, and the adjacent p-type well (sometimes this p-type well is formed across the substrate). Similarly, a parasitic NPN bipolar transistor may be formed along an n-type active region, the p-type well underlying the n-type active region (sometimes this p-type well is formed across the substrate), and the adjacent n-type well. The parasitic NPN and PNP bipolar transistors may be latched-up to form an inverter amplifier that shorts drain supply voltage Vdd and ground, which may lead to destruction of the device.

Tap cells may be implemented to prevent shorting of drain to ground by way of the parasitic bipolar transistors. In some instances, tap cells may be used to couple certain n-wells to Vdd (drain supply voltage or positive supply voltage) and the p-well on the substrate to Vss (source supply voltage or negative supply voltage). In some implementations, Vdd is the most positive voltage of the standard cell or IC device and Vss is the most negative voltage of the standard cell or IC device. Vss may be the ground voltage or may be grounded. Tap cells may take shape of a transistor but they do not have functional gate structures. Tap cells perform their latch-up prevention function through their source/drain regions. Different from transistors in standard cells, the active regions in a tap cell do not have a different conductivity type from that of the underlying well. For example, when a tap cell is formed over an n-well, it has an active region doped with n-type dopants, rather than p-type dopants. When a tap cell is formed over a p-well, it has an active region doped with p-type dopants, rather than n-type dopants.

While tap cells in conventional designs may address latch-up, their implementation may take up space and reduce functional density in an IC chip. For example, in some conventional designs, the n-wells and p-wells extend along the same direction, each have an elongated shape, and are alternately arranged. In these conventional designs, elongated active regions, such as fins or vertical stacks of channel members, may be formed over the n-wells or the p-wells and doped with different types of dopants. Although a tap cell and a standard cell may be formed in the same active region, the different doping types prevent them from being placed right next to each other. This is so because when an active region of the tap cell abuts an active region of a different conductivity type of the standard cell, it gives rise drift of electrical characteristics of the standard cells and deteriorated performance. To isolate a tap cell from an adjacent standard cell, discontinuations of the active regions are introduced. Because the active regions are disposed in and defined by an oxide containing isolation feature (such as a shallow trench isolation, or STI), the active regions may be referred to ODs and the discontinuations of the active regions may be referred to as OD breaks. In some embodiments, OD breaks are formed before the deposition of the isolation feature and the formation of the source/drain features. Because the OD breaks are formed before the deposition of the isolation feature, the material for the isolation feature is also deposited in the OD breaks. Because the OD breaks are formed before the formation of the source/drain features that exert stress on the active region, the active regions adjacent to the OD breaks are exposed to different environment and may have different properties. The OD breaks therefore also bring about a form of layout dependent effect (LDE) where the active region of the standard cell is broken by another active region of the tap cell. To address the LDE brought about by the OD breaks, dummy cells of various sizes may be introduced between the standard cells and the OD breaks to serve as a transition between an OD break and the standard cell. It can be seen that when tap cells are implementation, tap cells, OD breaks and dummy cells all take up space in an IC chip but are not functional.

The present disclosure provides embodiments of methods for forming a semiconductor oxide feature below a source/drain feature to obtain a pseudo silicon-on-insulator (SOI) structure. The semiconductor oxide feature insulates the source/drain feature from the substrate, thereby preventing latch-up without implementation of any tap cells or guard rings that may take up space. In addition, embodiments of the present disclosure may provide additional advantages. For example, the semiconductor oxide feature may prevent leakage through the anti-punch-through (APT) implantation region at the base of the channel region. Put differently, the present disclosure provides a structure that enjoys benefits of a bulk device and an SOI device.

Illustrated in FIG. 1 is a method 100 of forming a semiconductor device. Operations in method 100 will be described below in conjunction with FIGS. 2-19, which illustrate fragmentary cross-sectional views of a workpiece 200 that undergoes method 100. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Upon conclusion of the fabrication process, the workpiece 200 will be fabricated into a semiconductor device 200. In that sense, the workpiece 200 and the semiconductor device 200 may be used interchangeably as the context requires. Further, the exemplary semiconductor devices described herein may include various other devices and features, such as other types of devices including additional transistors, bipolar junction transistors, resistors, capacitors, inductors, diodes, fuses, SRAM and/or other logic circuits, etc., but is simplified for a better understanding of the inventive concepts of the present disclosure. In some embodiments, the exemplary devices include a plurality of semiconductor devices (e.g., transistors), which may be interconnected. Moreover, it is noted that the process steps of method 100 and figures provided in the present disclosure, are merely exemplary and are not intended to be limiting beyond what is specifically recited in the claims that follow.

Figure 2:
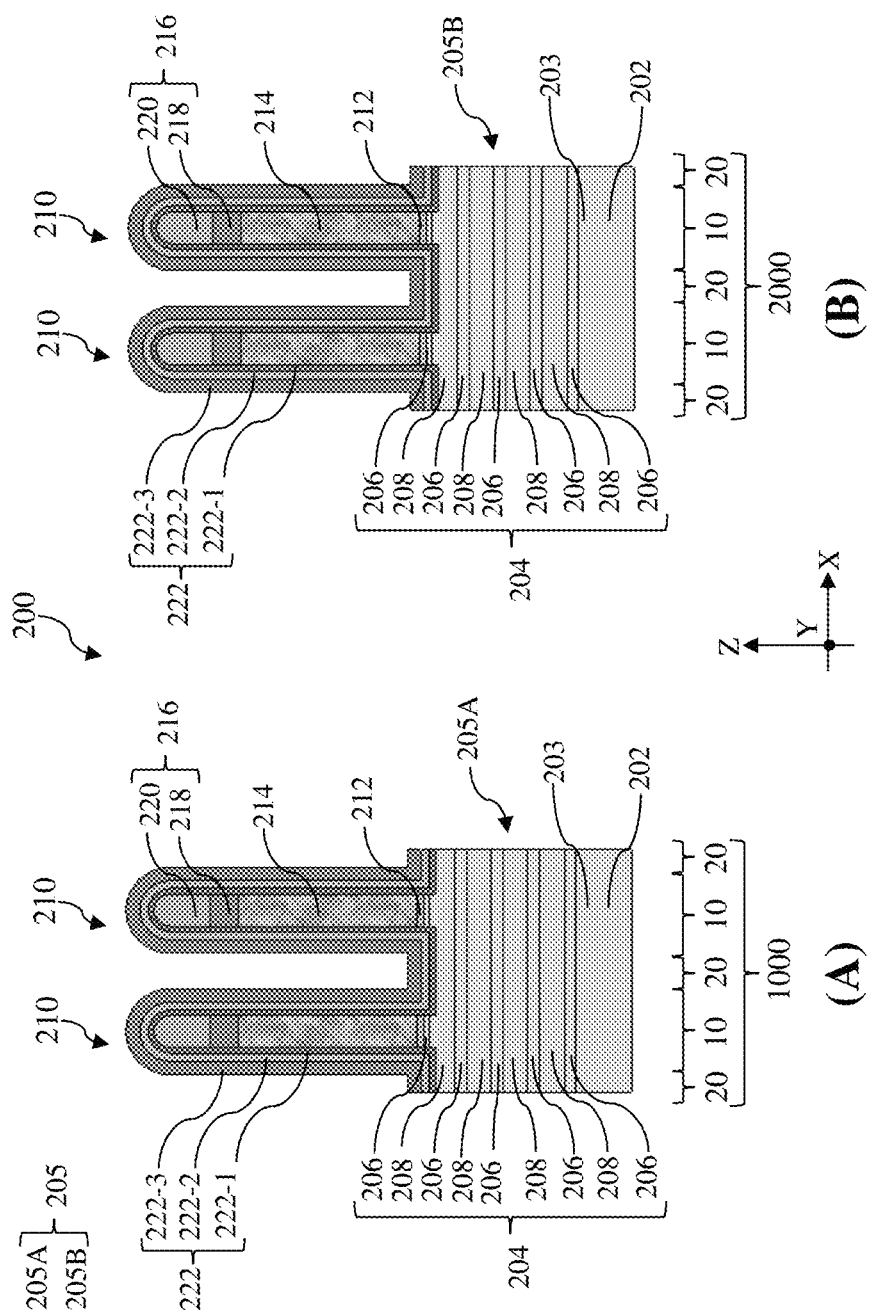
FIGS. 2-19 illustrate fragmentary cross-sectional views of a workpiece during a fabrication process according to the method of FIG. 1, according to one or more aspects of the present disclosure.

Each of FIGS. 2-19 includes a figure ending with A, such as FIG. 2A, and another figure ending with B, such as FIG. 2B. Each of the figures ending with A illustrates a fragmentary cross-sectional view of a first area 1000 of the workpiece 200 and each of the figures ending with B illustrate a fragmentary cross-sectional view of a second area 2000 of the workpiece 200. As will be described below, methods of the present disclosure allow different treatments to be implemented in the first area 1000 and the second area 2000.

Referring to FIGS. 1 and 2, method 100 includes a block 102 where a workpiece 200 is received. The workpiece 200 includes a plurality of alternating semiconductor layers over a first area 1000 and a second area 2000 thereof. As illustrated in FIG. 2, the workpiece 200 includes a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type multi-gate transistors, p-type multi-gate transistors). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant is performed to form an APT implantation region 203. The APT implantation region 203 is formed under a channel region and functions to prevent punch-through or unwanted diffusion.

In some embodiments represented in FIG. 2, an epitaxial stack 204 is formed over the substrate 202 in the first area 1000 and the second area 2000. The epitaxial stack 204 includes epitaxial layers 206 of a first semiconductor composition interposed by epitaxial layers 208 of a second semiconductor composition. The first and second semiconductor composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layers 206 include SiGe and the epitaxial layers 208 include Si.

It is noted that five (5) layers of the epitaxial layers 206 and four (4) layers of the epitaxial layers 208 are alternately arranged as illustrated in FIG. 2 and in subsequent figures, which are for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, the number of epitaxial layers 208 is between 2 and 10. In some embodiments, all epitaxial layers 206 may have a substantially uniform first thickness and all of the epitaxial layers 208 may have a substantially uniform second thickness. The first thickness and the second thickness may be identical or different. As described in more detail below, the epitaxial layers 208 or parts thereof may serve as channel member(s) for a subsequently-formed multi-gate device and the thickness of each of the epitaxial layers 208 is chosen based on device performance considerations. The epitaxial layers 206 in channel regions(s) may eventually be removed and serve to define a vertical distance (i.e., spacing) between adjacent channel region(s) for a subsequently-formed multi-gate device and the thickness of each of the epitaxial layers 206 is chosen based on device performance considerations. Accordingly, the epitaxial layers 206 may also be referred to as sacrificial layers 206, and epitaxial layers 208 may also be referred to as channel layers 208.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

Referring to FIGS. 1 and 2, method 100 includes a block 104 where a first fin structure 205A is formed in the first area 1000 and a second fin structure 205B is formed in the second area 2000. At block 104, the epitaxial stack 204 over the substrate 202 is patterned to form the first fin structure 205A in the first area 1000 and the second fin structure 205B in the second area 2000. The first fin structure 205A and the second fin structure 205B extend from the substrate 202 and extend lengthwise along the X direction. In some embodiments, the patterning also etches into the substrate 202 such that each of the first fin structure 205A and the second fin structure 205B includes a lower portion formed from the substrate 202 and an upper portion from the epitaxial stack 204. The upper portion includes each of the epitaxial layers of the epitaxial stack 204. The first and second fin structures 205A and 205B may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the first fin structure 205A and the second fin structure 205B by etching the epitaxial stack 204. The etching process can include dry etching, wet etching, reactive ion etching (RIE), and/or other suitable processes.

While not explicitly shown in FIG. 2, after the first fin structure 205A and the second fin structure 205B are formed, isolation feature is formed between neighboring first fin structures 205A and between neighboring second fin structure 205B. The isolation feature may also be referred to as a shallow trench isolation (STI) feature. By way of example, in some embodiments, a dielectric layer is first deposited over the substrate 202, filling the trenches between fin structures (such as the first fin structure 205A and the second fin structure 205B) with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features. The first fin structure 205A and the second fin structure 205B rise above the STI features. In some embodiments, the dielectric layer (and the subsequently formed STI features) may include a multi-layer structure, for example, having one or more liner layers.

Referring still to FIGS. 1 and 2, method 100 includes a block 106 where dummy gate stacks 210 are formed over channel regions 10 of the first fin structure 205A in the first area 1000 and the second fin structure 205B in the second area 2000. In some embodiments, a gate replacement process (or gate-last process) is adopted where the dummy gate stacks 210 serve as placeholders for functional gate structures and are to be removed and replaced by the functional gate structures in subsequent operations. Other processes and configuration are possible. In some embodiments, the dummy gate stacks 210 are formed over the substrate 202 and are at least partially disposed over the first fin structure 205A and the second fin structure 205B. The portion of the first fin structure 205A underlying the dummy gate stack 210 is a channel region 10 of the first fin structure 205A or the second fin structure 205B. The dummy gate stacks 210 may also define source/drain (S/D) regions 20 adjacent to and on opposing sides of the channel regions 10.

In the illustrated embodiment, block 106 first forms a dummy gate dielectric layer 212 over the fin structures 205 (including the first fin structures 205A and the second fin structures 205B). In some embodiments, the dummy gate dielectric layer 212 may include silicon oxide, silicon nitride, a high-K dielectric material and/or other suitable material. In various examples, the dummy gate dielectric layer 212 may be deposited by a CVD process, a sub-atmospheric CVD (SACVD) process, a flowable CVD process, an ALD process, a PVD process, or other suitable process. By way of example, the dummy gate dielectric layer 212 may be used to prevent damages to the fin structures 205 by subsequent processes (e.g., formation of the dummy gate stack). Subsequently, block 106 forms other portions of the dummy gate stacks 210, including a dummy electrode layer 214 and a hard mask 216, which may include multiple layers 218 and 220. In some embodiments, the dummy gate stacks 210 are formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 214 may include polycrystalline silicon (polysilicon). The hard mask 216 may include multiple layers. In some embodiments, the hard mask 216 includes an oxide layer 218, such as a pad oxide layer that may include silicon oxide, and a nitride layer 220, such as a pad nitride layer that may include silicon nitride, silicon oxynitride and/or silicon carbide.

Still referring to FIG. 2, in some embodiments, after formation of the dummy gate stacks 210, the dummy gate dielectric layer 212 is removed from the source/drain regions 20 of the fin structures 205. That is, the dummy gate dielectric layer 212 that is not covered by the dummy electrode layer 214 is removed. The removal process may include a wet etch, a dry etch, and/or a combination thereof. The etch process is chosen to selectively etch the dummy gate dielectric layer 212 without substantially etching the fin structures 205, the hard mask 216, and the dummy electrode layer 214.

Referring still to FIGS. 1 and 2, method 100 includes a block 108 where a gate spacer layer 222 is formed over the dummy gate stacks 210. In some embodiments, spacer material for forming the gate spacer layer 222 is deposited conformally over the workpiece 200, including over top surfaces and sidewalls of the dummy gate stack 210 and the fin structures 205 to form a spacer material layer. The term "conformally" may be used herein for ease of description of a layer having substantially uniform thickness over various regions. The gate spacer layer 222 may have a single-layer construction or include multiple layers. In some embodiments represented in FIG. 2, the gate spacer layer 222 includes a first gate spacer layer 222-1, a second gate spacer layer 222-2, and a third gate spacer layer 222-3. In these embodiments, the first gate spacer layer 222-1, the second gate spacer layer 222-2, and the third gate spacer layer 222-3 may have different compositions to introduce etch selectivity. The first gate spacer layer 222-1, the second gate spacer layer 222-2, and the third gate spacer layer 222-3 may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide, silicon oxycarbide, or silicon oxide. The spacer material layer may be deposited over the dummy gate stacks 210 and the fin structures 205 using processes such as, CVD process, a subatmospheric CVD (SACVD) process, a flowable CVD process, an ALD process, a PVD process, or other suitable process.

Figure 3:
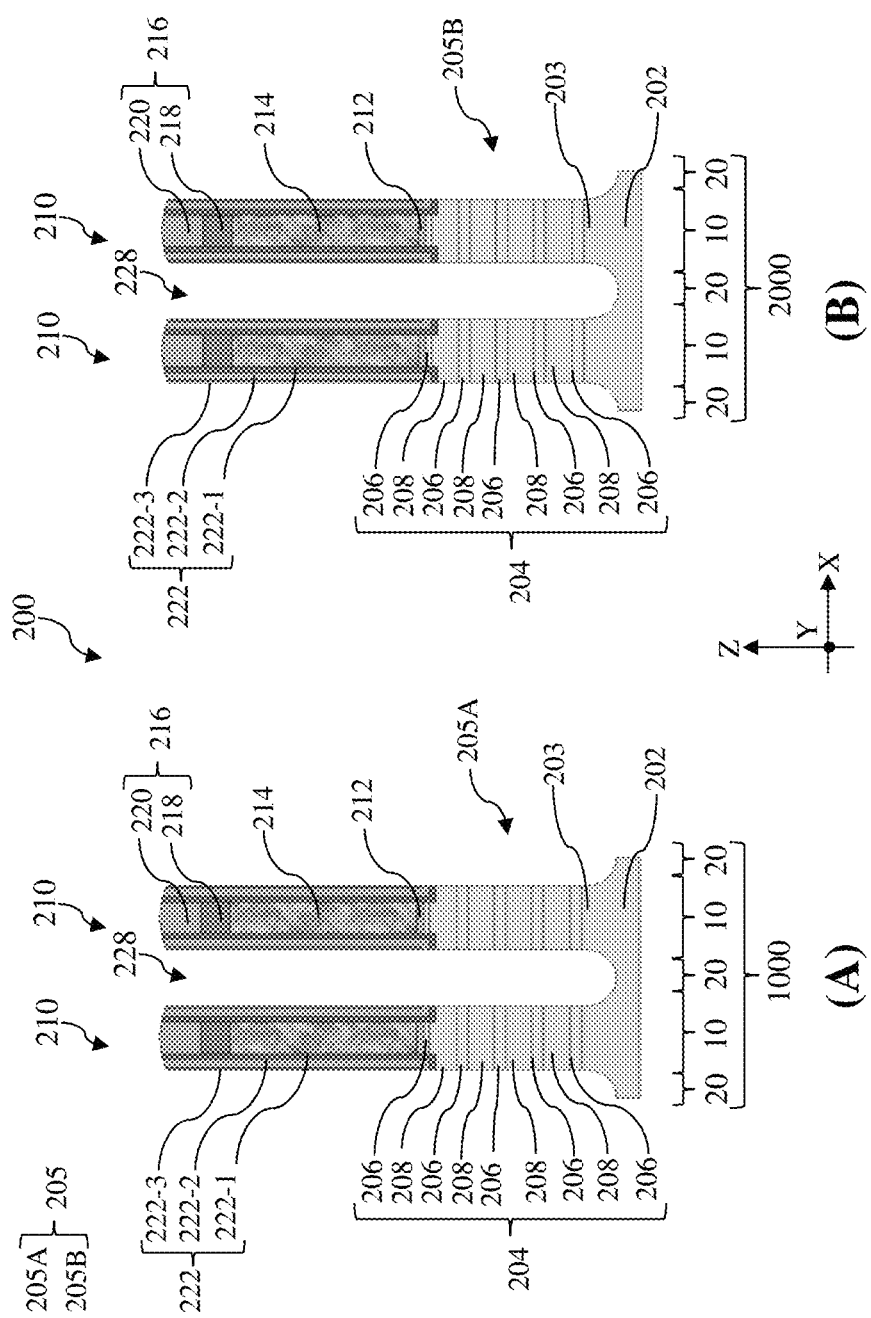

Referring to FIGS. 1 and 3, method 100 includes a block 110 where source/drain trenches 228 are formed. While not explicitly shown, a photolithography process and at least one hard mask may be used to perform operations at block 110. In some embodiments, the portions of the fin structures 205 that are not covered by the dummy gate stacks 210 and the gate spacer layer 222 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 3, the upper portions of the fin structures 205 are recessed to expose the sacrificial layers 206 and the channel layers 208 in the source/drain trenches 228. In some implementations, at least a portion of the lower portion of the fin structures 205 are recessed as well. That is, the source/drain trenches 228 may extend below the bottom-most sacrificial layer 206 and into the APT implantation region 203.

Figure 4:
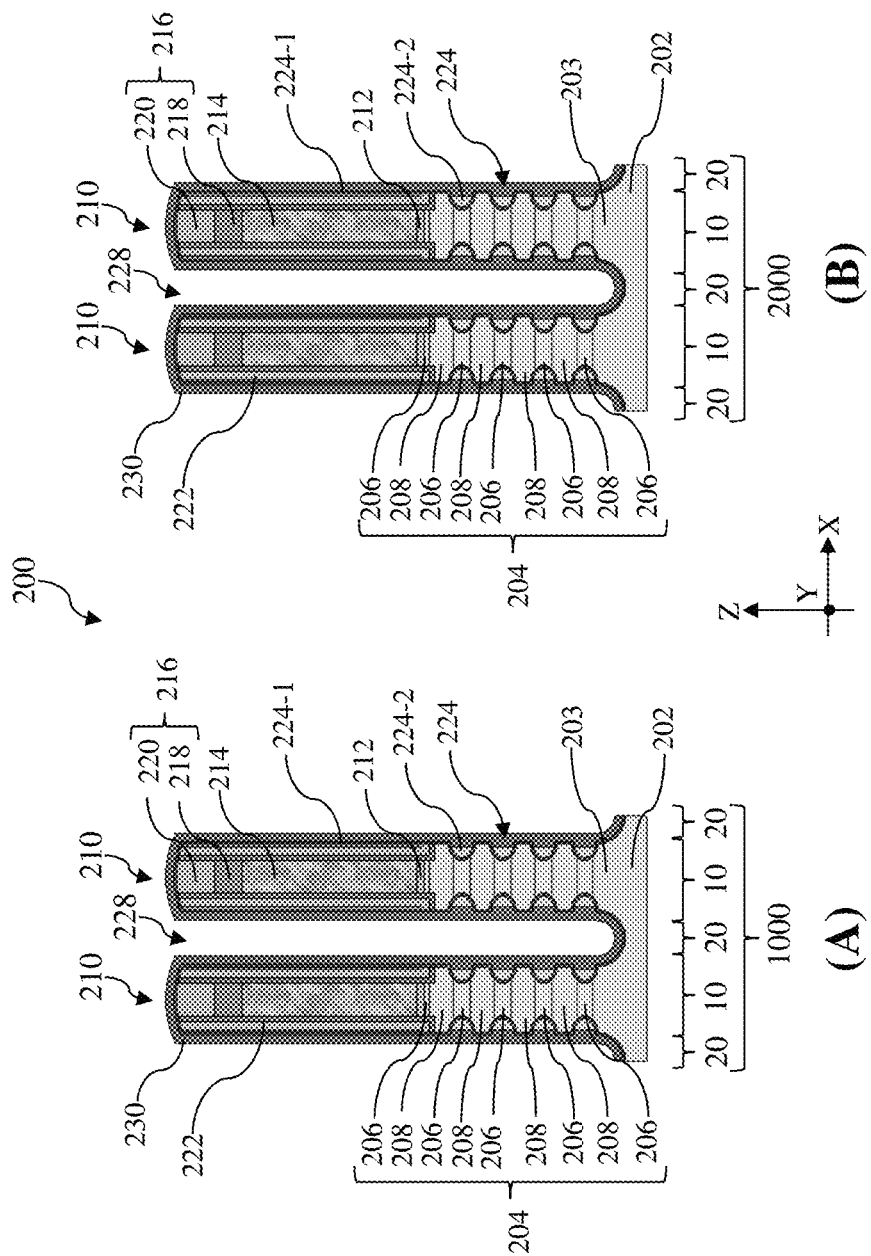

Referring to FIGS. 1 and 4, method 100 includes a block 112 where inner spacer features 224 are formed. Operations at block 112 include formation of inner spacer recesses, deposition of inner spacer layers, and pull-back of the deposited inner spacer layers. Referring to FIG. 4, after the sacrificial layers 206 and the channel layers 208 are exposed in the source/drain trenches 228, the sacrificial layers 206 are selectively and partially recessed to form inner spacer recesses (filled with the inner spacer features 224 in FIG. 4) that are disposed between neighboring channel layers 208 while the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. As shown in FIG. 4, the inner spacer recesses extend along the X direction into the channel regions 10 from the source/drain trench 228. In some embodiments, the selective wet etching process may include a hydro fluoride (HF) or NH$_4$OH etchant.

At block 112, after the inner spacer recesses are formed, one or more inner spacer layers may be deposited over the first area 1000 and the second area 2000 of the workpiece 200. In some embodiment illustrated in FIG. 4, two inner spacer layers—a first inner spacer layer 224-1 and a second inner spacer layer 224-2, are deposited at block 112. The first inner spacer layer 224-1 and the second inner spacer layer 224-2 may be formed of a material selected from silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide, silicon oxycarbide, and silicon oxide. In one embodiment, the first inner spacer layer 224-1 may be formed of carbon-rich silicon carbonitride and the second inner spacer layer 224-2 may be formed of silicon oxide. The first inner spacer layer 224-1 and the second inner spacer layer 224-2 may be deposited by CVD, PECVD, LPCVD, ALD or other suitable method. Each of the first inner spacer layer 224-1 and the second inner spacer layer 224-2 may be formed to a thickness between about 1 nm and about 5 nm.

The one or more inner spacer layers may then be pulled back (i.e., etched back) to form the inner spacer features 224 in the inner spacer recesses. In some embodiments, the second inner spacer layer 224-2 is isotropically and selectively etched back until the second inner spacer layer 224-2 is completely removed from the top surfaces of the hard mask 216, top surfaces of the gate spacer layer 222, portions of the substrate 202 exposed in the source/drain trenches 228, and the first inner spacer layer 224-1 disposed over the gate spacer layer 222. The composition of the first inner spacer layer 224-1 is different from the composition of the second inner spacer layer 224-2 such that the second inner spacer layer 224-2 may be selectively etched while the first inner spacer layer 224-1 experiences a slow etch rate. In some implementations, the isotropic etch performed at block 112 may include use of hydrogen fluoride, fluorine gas, hydrogen, ammonia, nitrogen trifluoride, or other fluorine-based etchants. As shown in FIG. 4, the pulled-back second inner spacer layer 224-2 and the first inner spacer layer 224-1 in an inner spacer recess constitutes an inner spacer feature 224. The inner spacer features 224 partially separate two neighboring channel layers 208 from one another or partially separate a bottom-most channel layer 208 from the APT implantation region 203.

Referring to FIGS. 1 and 4, method 100 includes a block 114 where a first blocking layer 230 is deposited over the workpiece 200. In some embodiments, the first blocking layer 230 is formed of a dielectric material that is not amenable for epitaxial growth such that it may be used to restrict epitaxial growth of semiconductor materials to a pre-determined area. The first blocking layer 230 may be formed of a material selected from silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide, silicon oxycarbide, and silicon oxide. In one embodiment, the first blocking layer 230 may include silicon nitride. As shown in FIG. 4, the first blocking layer 230 may be deposited over the first inner spacer layer 224-1 (that is deposited over the hard mask 216, the gate spacer layer 222, and a portion of the substrate 202 exposed in the source/drain trench 228) and the inner spacer features 224. In some instances, the first blocking layer 230 may be deposited using ALD.

Figure 5:
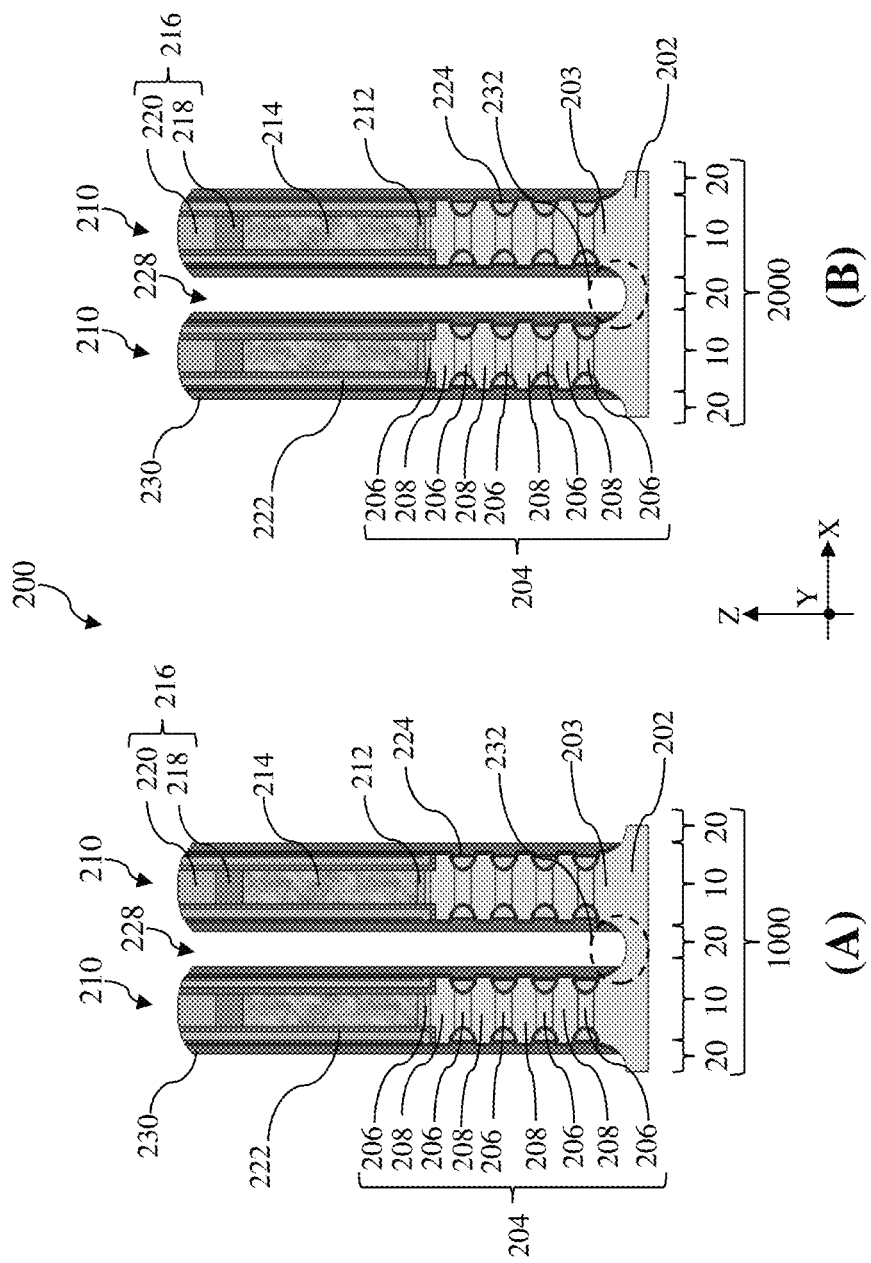

Referring to FIGS. 1 and 5, method 100 includes a block 116 where the first blocking layer 230 is anisotropically pulled back such that the portion of the first blocking layer 230 on top-facing surfaces is removed. As shown in FIG. 5, at the conclusion of operations at block 116, a portion of the substrate 202 at the bottom of the source/drain trench 228 is exposed to form a growth surface 232 while the channel layers 208 remain covered by the first blocking layer 230. In some implementations, the etch-back of the first blocking layer 230 may be performed by dry etching or a suitable etch process.

Figure 6:
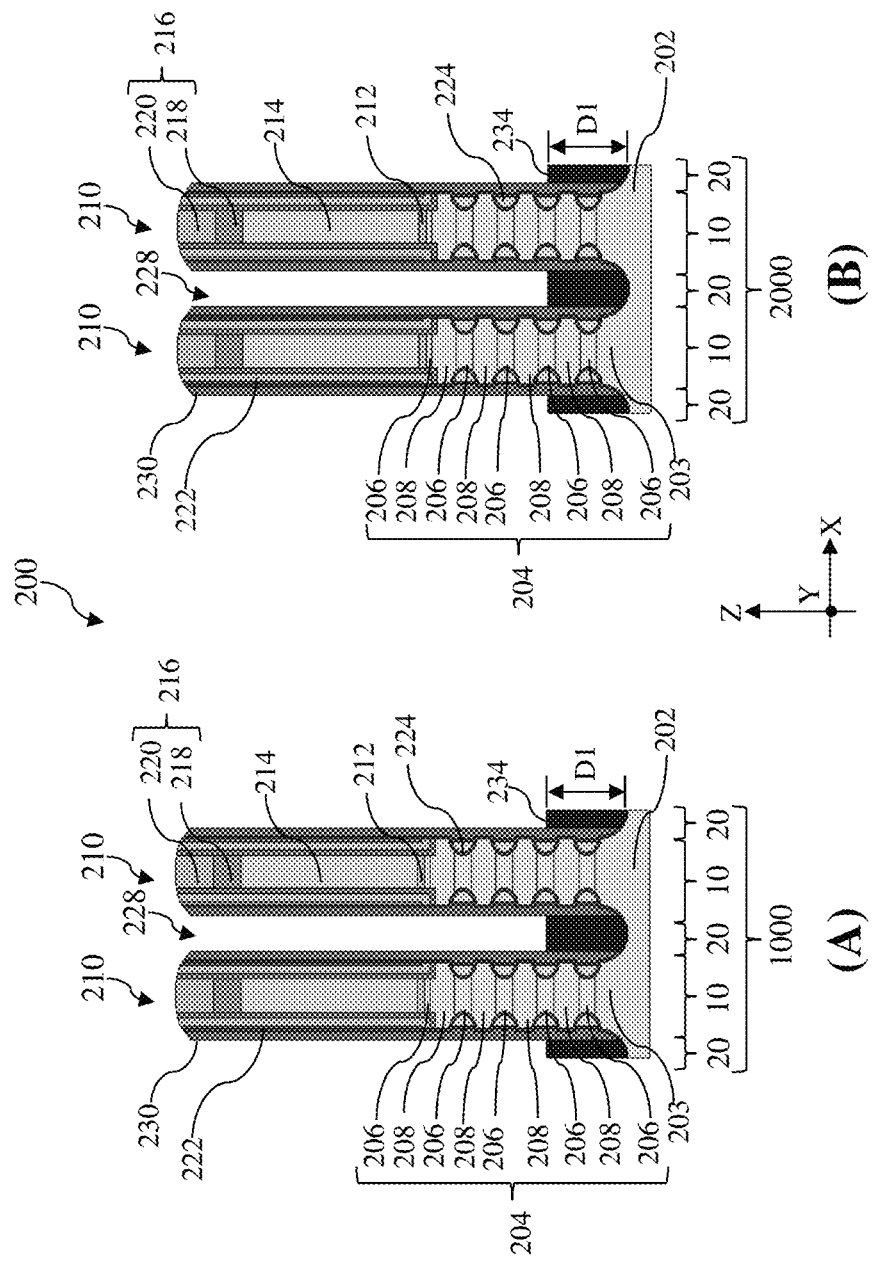

Referring to FIGS. 1 and 6, method 100 includes a block 118 where a first epitaxial feature 234 is epitaxially formed in the source/drain trenches 228 over the source/drain regions 20. In some embodiments, the first epitaxial feature 234 may be selectively and epitaxially grown from the growth surface 232 illustrated in FIG. 5. In these implementations, the first epitaxial feature 234 is formed of semiconductor materials and may include silicon and germanium. In one embodiment, the first epitaxial feature 234 includes an alloy semiconductor material including silicon and germanium where silicon accounts for between about 55 at. % (atomic percentage) and about 80 at. % (atomic percentage) and germanium accounts for between about 20 at. % (atomic percentage) and about 45 at. % (atomic percentage). It has been observed that the first epitaxial feature 234 may grow from exposed semiconductor surfaces, such as the growth surface 232 shown in FIG. 5 and may not grow from surfaces of dielectric materials, such as surfaces of the first blocking layer 230. The arrangement of the first blocking layer 230 therefore ensures that the first epitaxial feature 234 grows from the growth surface 232 in a bottom-up fashion. As shown in FIG. 6, the first epitaxial feature 234 may be formed to a first depth D1 measured from a top surface of the substrate 202. In some instances, the first depth D1 is such that a top surface of the first epitaxial feature 234 is farther away from the substrate 202 than a top surface of the bottom-most channel member 208.

Figure 7:
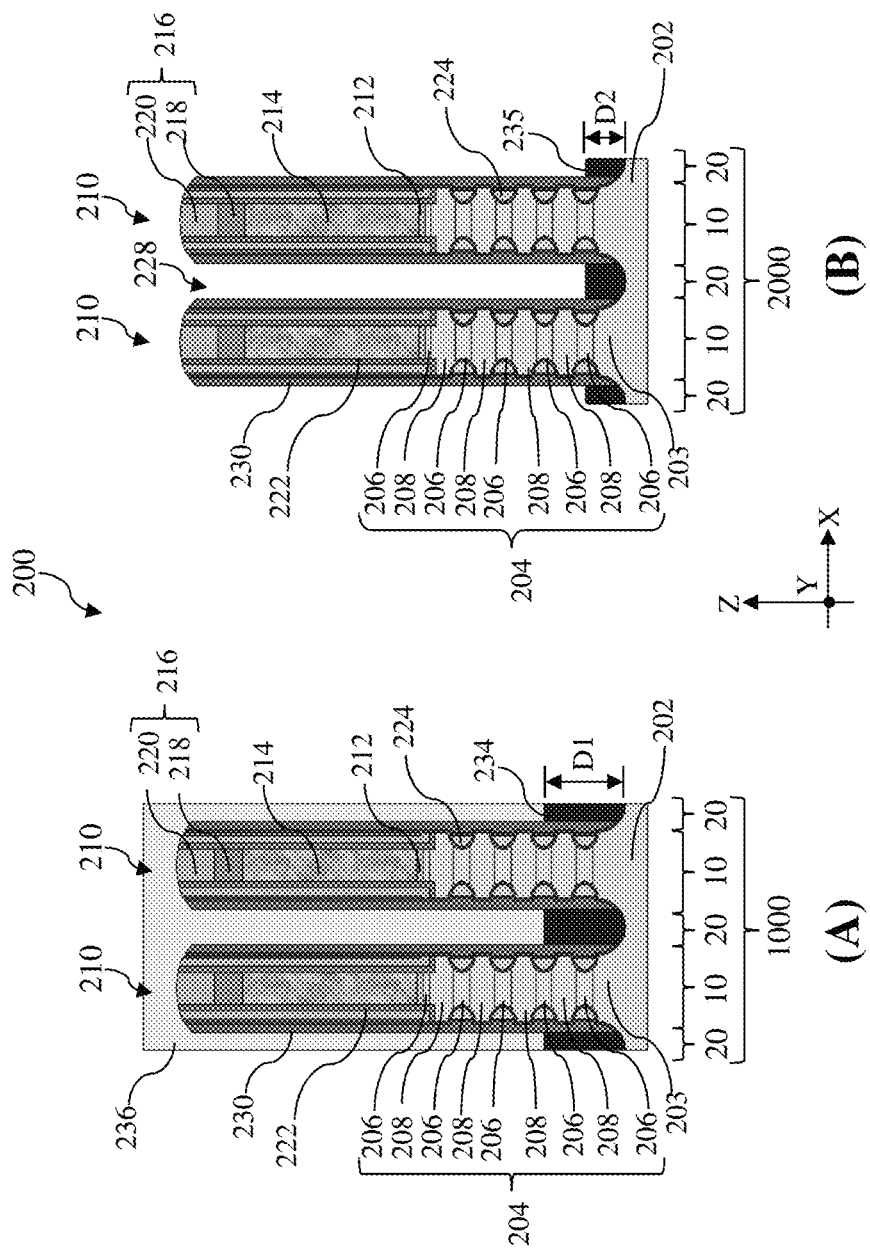
Figure 8:
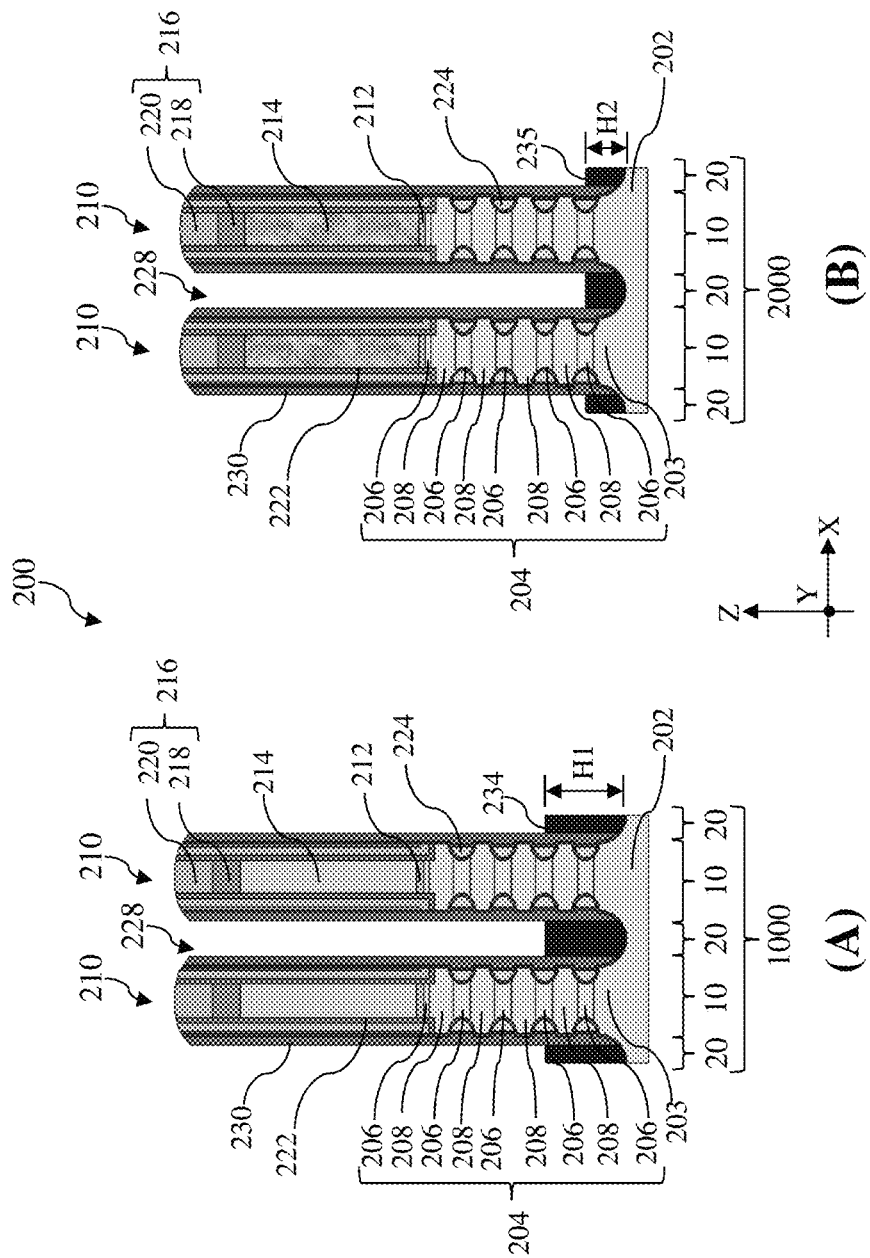

Referring to FIGS. 1, 7 and 8, method 100 may optionally include a block 120 where the first epitaxial feature 234 in the second area 2000 is selectively pulled back to a second depth D2 smaller than the first depth D1. As shown in FIG. 7, in order to selectively pull back the first epitaxial feature 234 in the second area 2000, a first bottom anti-reflective coating (BARC) layer 236 may be used to mask the first area 1000. To form the BARC mask over the first area 1000, a BARC material layer may be blanketly deposited over the workpiece 200 and photolithography techniques may be used to pattern the BARC material layer into the first BARC layer 236 over the first area 1000. In an example process, a photoresist layer is deposited over the BARC material layer using spin-on coating. The photoresist layer is then pre-baked, exposed to a radiation source, post-baked, and developed in a developer solution to form a patterned photoresist layer. The blanket BARC material layer is etched using the patterned photoresist layer as an etch mask to form the first BARC layer 236. With the first BARC layer 236 masking the first area 1000, the first epitaxial feature 234 in the second area 2000 may then be etched to obtain a second epitaxial feature 235. The second epitaxial feature 235 has a second thickness D2 that is smaller than the first thickness D1. As shown in FIG. 7, the second thickness D2 is such that a top surface of the second epitaxial feature 235 is lower than a bottom surface of the bottom-most channel member 208. Reference is now made to FIG. 8. After the pull-back of the first epitaxial feature 234, the first BARC layer 236 may be removed from the first area 1000, as shown in FIG. 8.

Figure 9:
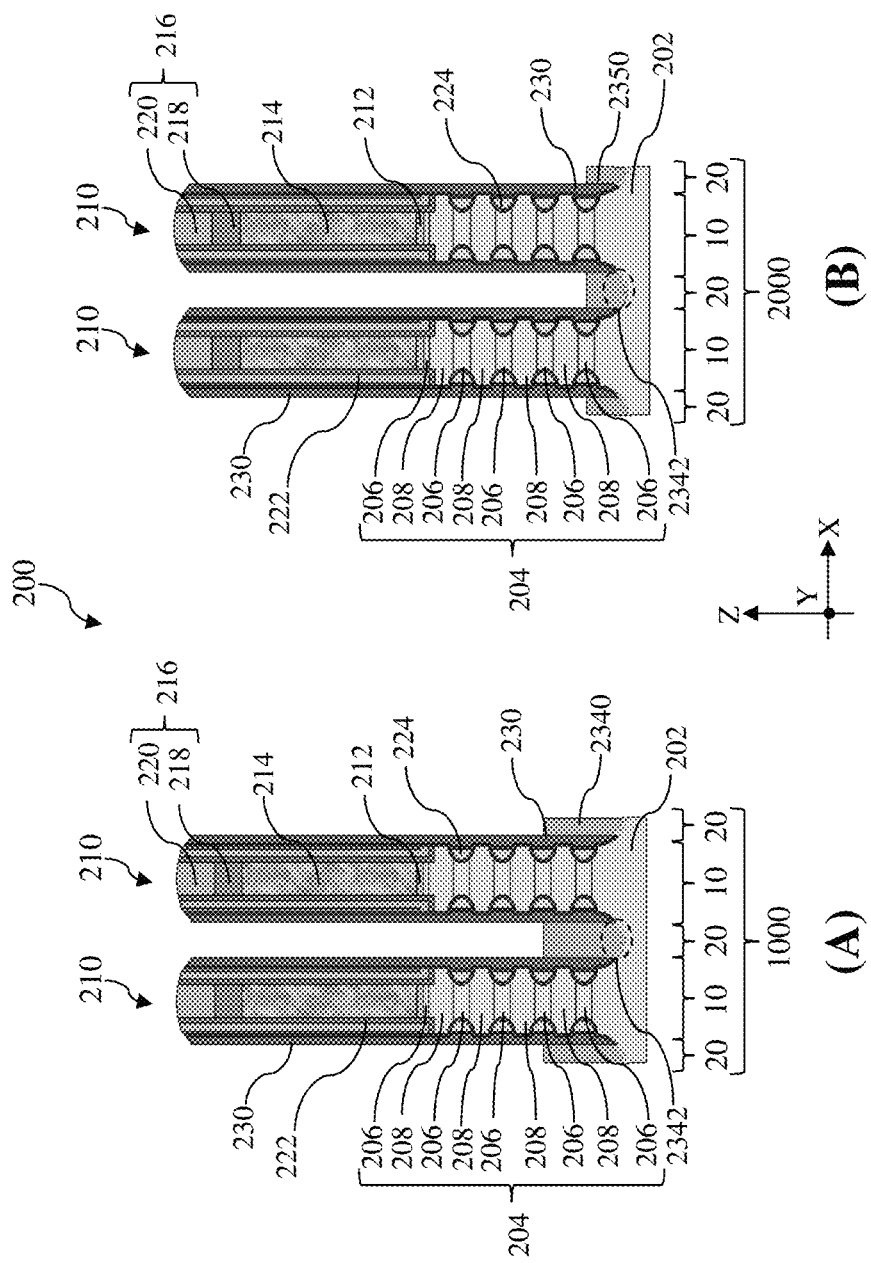

Referring to FIGS. 1 and 9, method 100 includes a block 122 where the first epitaxial features 234 are oxidized. In some embodiments, at block 122, the workpiece 200 may undergo an anneal process to turn the first epitaxial feature 234 and the second epitaxial feature 235 into a first semiconductor oxide feature 2340 and a second semiconductor oxide feature 2350, respectively. In the embodiments where the first epitaxial feature 234 and the second epitaxial feature 235 are formed of silicon germanium (SiGe), the first semiconductor oxide feature 2340 and the second semiconductor oxide feature 2350 are formed of silicon germanium oxide. In some implementations, the anneal process may include a rapid thermal anneal (RTA) process, a laser spike anneal process, a flash anneal process, or a furnace anneal process. In some instances, the anneal process may include an anneal temperature between about 300° C. and about 650° C. In some embodiments, the anneal process at block 122 may also include use of an oxidizing agent such as ozone, water, or oxygen. In the first area 1000, a remaining portion of the first blocking layer 230 is disposed between the first semiconductor oxide feature 2340 and the bottom-most channel layer 208 as well as between the first semiconductor oxide feature 2340 and the APT implantation region 203. Similarly, in the second area 2000, a remaining portion of the first blocking layer 230 is disposed between the second semiconductor oxide feature 2350 and the bottom-most channel layer 208 as well as between the second semiconductor oxide feature 2350 and the APT implantation region 203.

The composition of the first epitaxial feature 234 and the second epitaxial feature 235 is selected such that they may be sufficiently oxidized without damaging the substrate 202 and the channel layers 208. As described above, the first epitaxial feature 234 as well as the second epitaxial feature 235 may include an alloy semiconductor material including silicon and germanium where silicon accounts for between about 55 at. % (atomic percentage) and about 80 at. % (atomic percentage) and germanium accounts for between about 20 at. % (atomic percentage) and about 45 at. % (atomic percentage). It has been observed that when silicon atomic concentration is greater than 80%, the oxidation of silicon and germanium may not be sufficiently catalyzed by the presence of germanium and the oxidation rate may not be high enough to efficiently oxidize the first epitaxial feature 234 and the second epitaxial feature 235. However, when the silicon atomic concentration is smaller than 55%, too many defects may be present in the first epitaxial feature 234 and the second epitaxial feature 235.

Reference is still made to FIG. 9. In the embodiments where the first epitaxial feature 234 and the second epitaxial feature 235 are formed of silicon germanium (SiGe), germanium (Ge) may accumulate at their interfaces with the substrate 202. The accumulation of germanium (Ge) may lead to a germanium feature 2342 between a bottom surface of the first semiconductor oxide feature 2340 and the substrate 202 as well as between a bottom surface of the second semiconductor oxide feature 2350 and the substrate 202.

Figure 10:
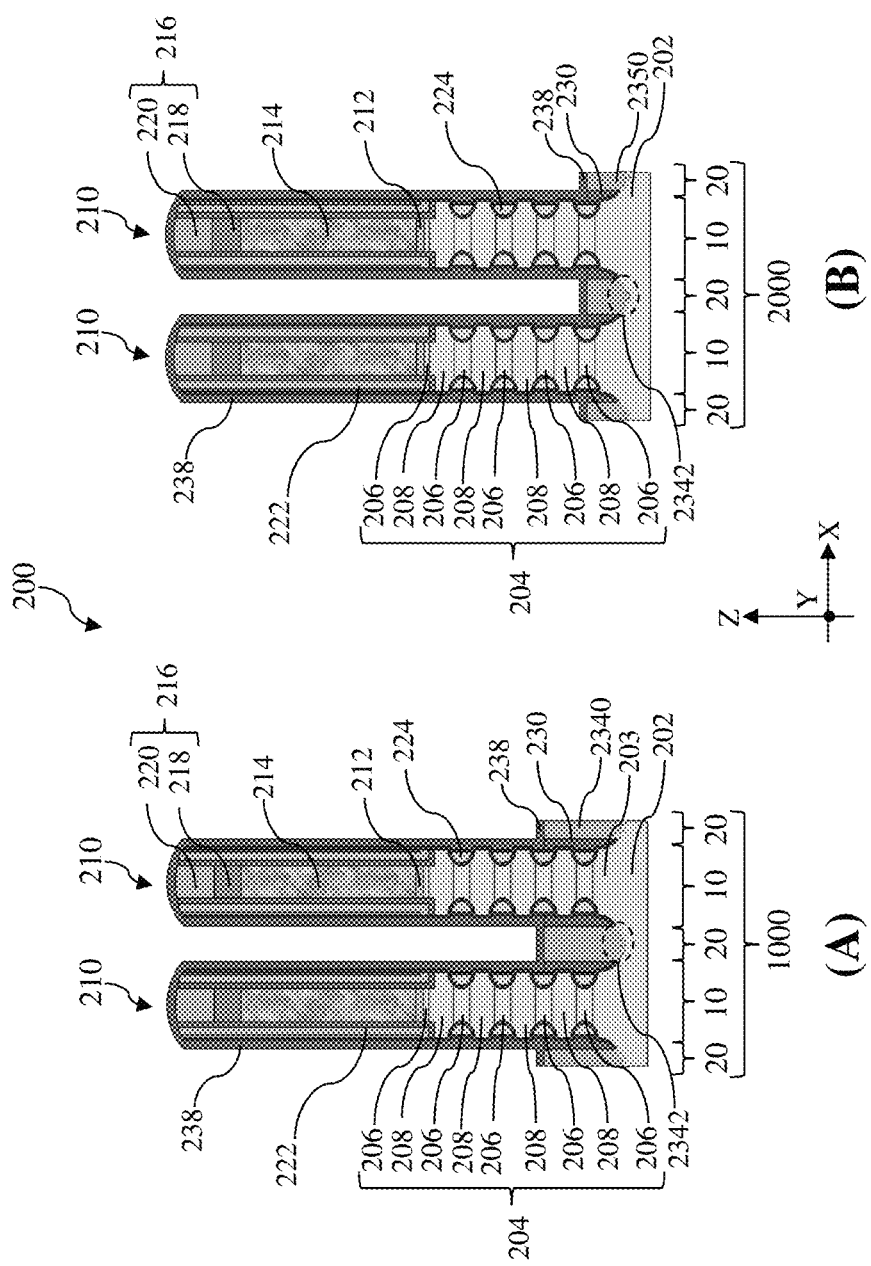

Referring to FIGS. 1 and 10, method 100 includes a block 124 where a second blocking layer 238 is deposited over the workpiece. In some instances, the first blocking layer 230 may have been damaged due to etch and anneal processes leading to operations at block 124. To satisfactorily protect the underlying structures, the first blocking layer 230 may be selectively removed using a suitable etch process and the second blocking layer 238 is deposited anew. That is, at block 124, the first blocking layer 230 is replaced with the second blocking layer 238. As the composition and formation of the second blocking layer 238 are substantially similar to those of the first blocking layer 230, detailed description of the second blocking layer 238 will not be repeated. The second blocking layer 238 is deposited over the first semiconductor oxide feature 2340 in the first area 1000, the second semiconductor oxide feature 2350 in the second area 2000, the gate spacer layer 222, the hard mask 216, the channel layers 208, and the inner spacer features 224. In embodiments represented in FIG. 10, the second blocking layer 238 is deposited directly on the first semiconductor oxide feature 2340 in the first area 1000, the second semiconductor oxide feature 2350 in the second area 2000, the gate spacer layer 222, the hard mask 216, the channel layers 208, and the inner spacer features 224.

Figure 11:
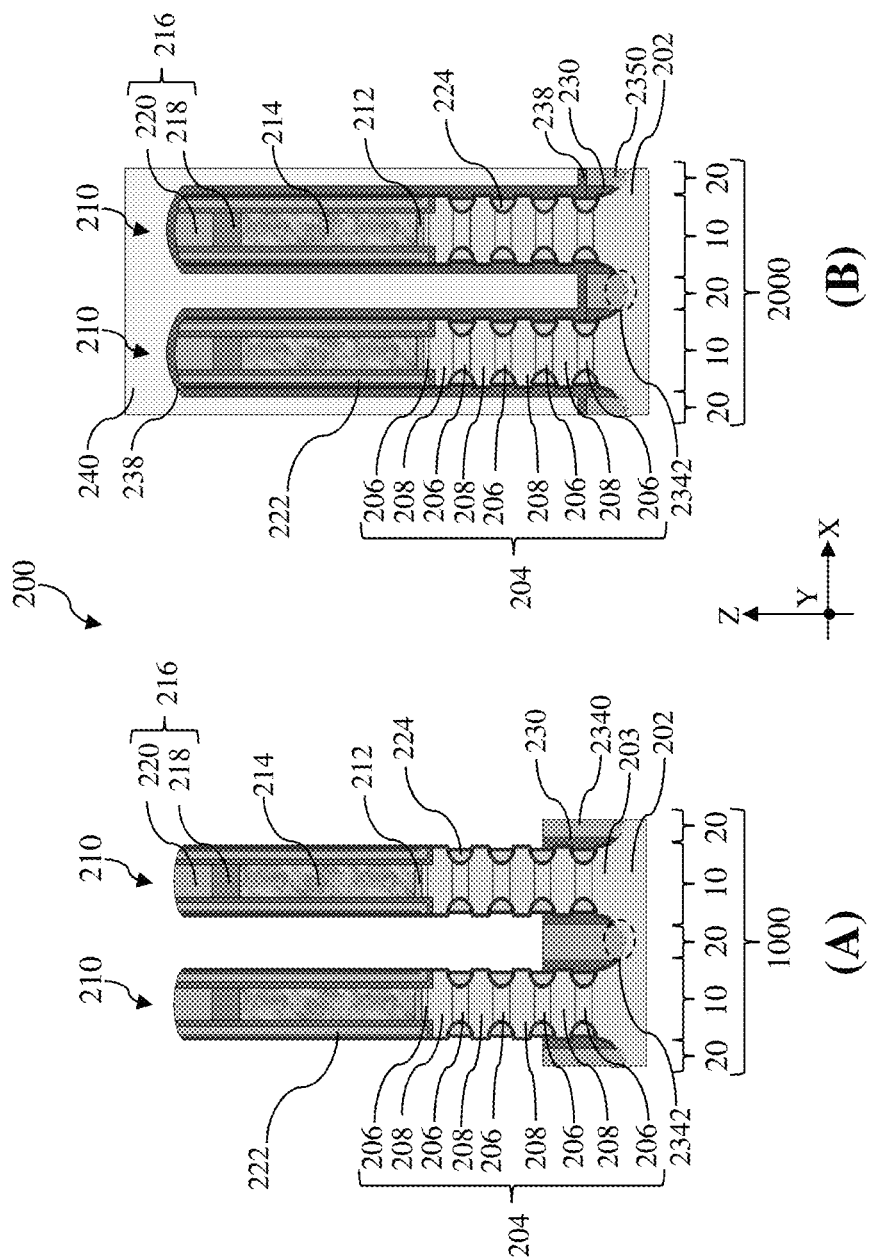
Figure 12:
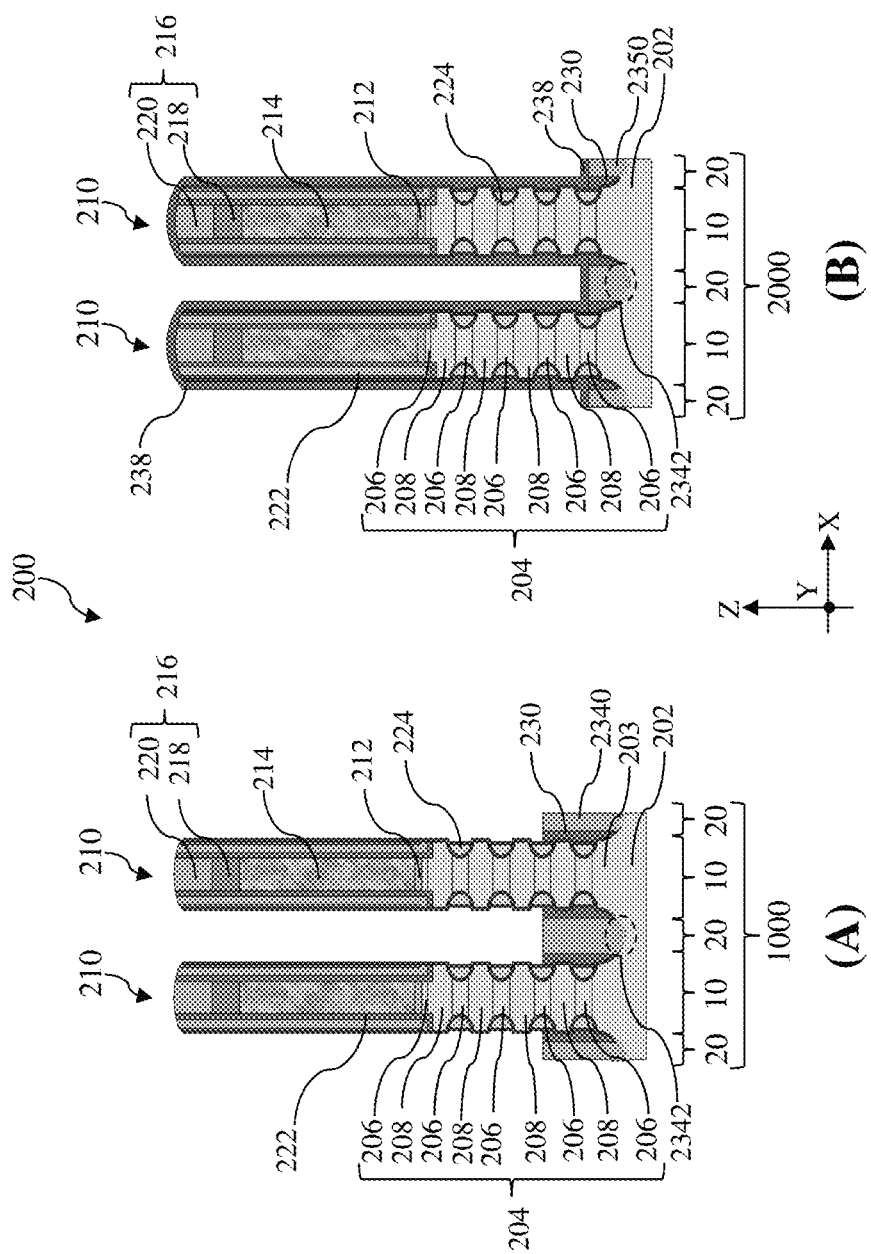

Referring to FIGS. 1, 11 and 12, method 100 includes a block 126 where the second blocking layer 238 in the first area 1000 is selectively removed. As shown in FIG. 11, in order to selectively remove the second blocking layer 238 in the first area 1000, a second bottom anti-reflective coating (BARC) layer 240 may be used to mask the second area 2000. To form the BARC mask over the second area 2000, a BARC material layer may be blanketly deposited over the workpiece 200 and photolithography techniques may be used to pattern the BARC material layer into the second BARC layer 240 over the second area 2000. In an example process, a photoresist layer is deposited over the BARC material layer using spin-on coating. The photoresist layer is then pre-baked, exposed to a radiation source, post-baked, and developed in a developer solution to form a patterned photoresist layer. The blanket BARC material layer is etched using the patterned photoresist layer as an etch mask to form the second BARC layer 240. With the second BARC layer 240 masking the second area 2000, the second blocking layer 238 in the first area 1000 may be selectively removed to expose sidewalls (side surfaces) of the channel layers 208. Reference is now made to FIG. 12. After the removal of the second blocking layer 238 in the first area 1000, the second BARC layer 240 may be removed from the second area 2000.

Figure 13:
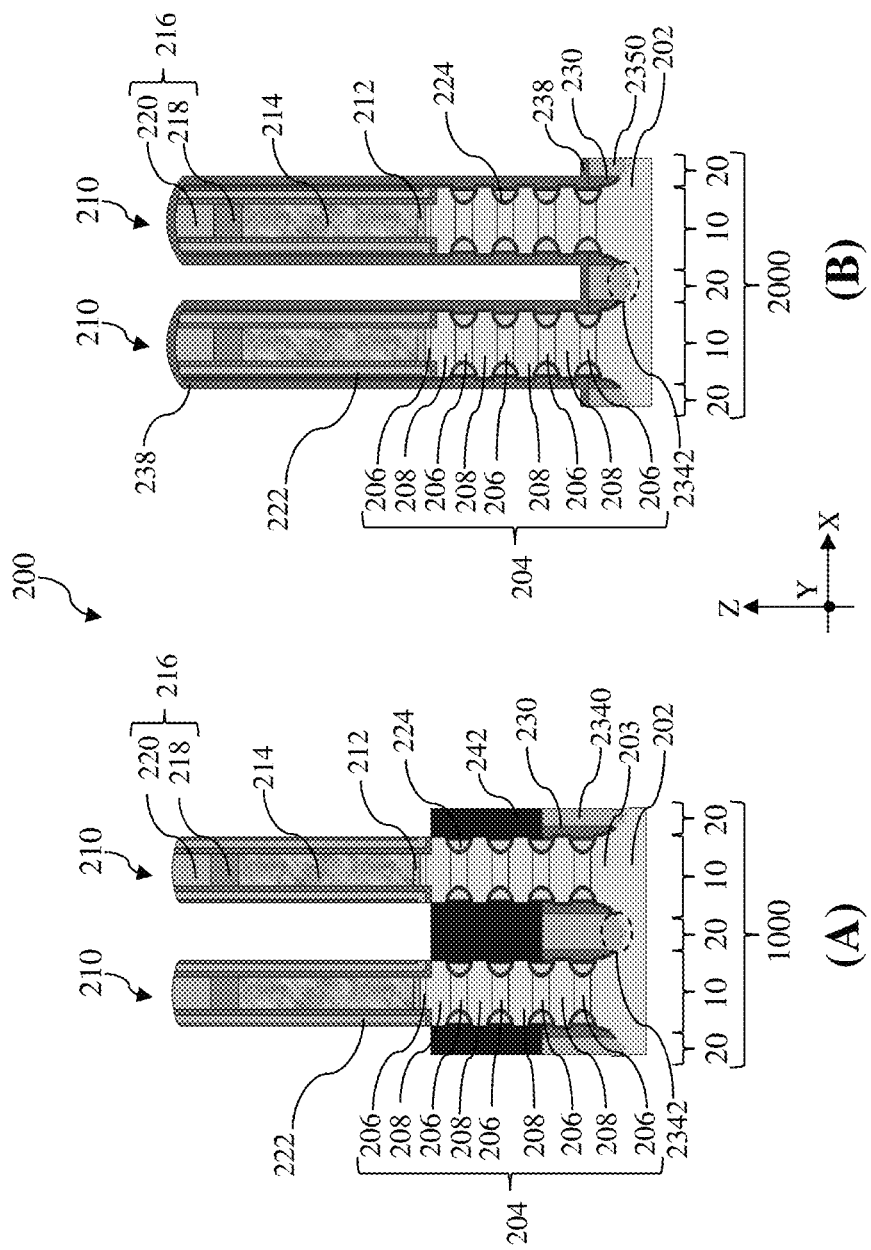

Referring to FIGS. 1 and 13, method 100 includes a block 128 where a first source/drain feature 242 is selectively deposited in the first area 1000. Suitable epitaxial processes for block 128 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the channel layers 208. In the embodiments represented in FIGS. 13A and 13B, the first source/drain features 242 grows from the channel layers 208 and does not grow on the second blocking layer 238 in the second area 2000. The first source/drain features 242 is spaced apart from the substrate 202 by the first semiconductor oxide feature 2340 and the first blocking layer 230 in the first area 1000. In addition, the first source/drain features 242 is also spaced apart from the sacrificial layers 206 by the inner spacer features 224. Depending on design needs, the first source/drain feature 242 may be n-type or p-type. When the first source/drain feature 242 is n-type, the first source/drain feature 242 may include Si, GaAs, GaAsP, SiP, or other suitable material. When the first source/drain feature 242 is p-type, the first source/drain feature 242 may include Si, Ge, AlGaAs, SiGe, boron-doped SiGe (SiGeB), or other suitable material. The first source/drain features 242 may be in-situ doped during the epitaxial process by introducing doping species including dopants. If the first source/drain feature 242 is not in-situ doped, an implantation process (i.e., a junction implant process) is performed to dope the first source/drain feature 242. In one embodiment, the first source/drain feature 242 is p-type and includes boron-doped silicon germanium (SiGeB).

Figure 14:
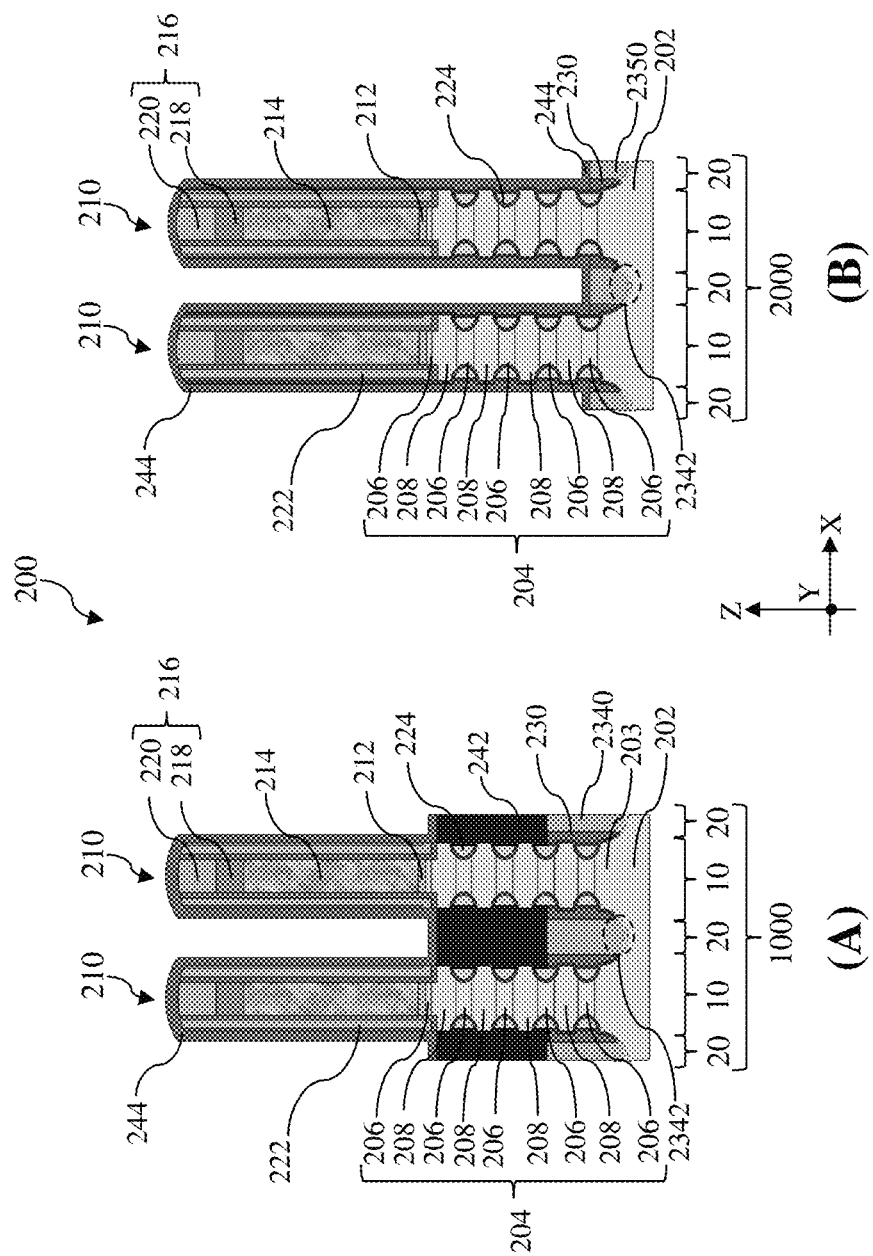

Referring to FIGS. 1 and 14, method 100 includes a block 130 wherein a third blocking layer 244 is deposited over the workpiece 200. In some instances, the second blocking layer 238 may have been damaged due to processes leading to operations at block 130. To satisfactorily protect the underlying structures, the second blocking layer 238 may be selectively removed using a suitable etch process and the third blocking layer 244 is deposited anew. That is, at block 130, the second blocking layer 238 is replaced with the third blocking layer 244. As the composition and formation of the third blocking layer 244 are substantially similar to those of the first blocking layer 230, detailed description of the third blocking layer 244 will not be repeated. As shown in FIG. 14A, in the first area 1000, the third blocking layer 244 is deposited on the first source/drain feature 242, the gate spacer layer 222, and the hard mask 216. As shown in FIG. 14B, in the second area 2000, the third blocking layer 244 is deposited on the second semiconductor oxide feature 2350, the gate spacer layer 222, the hard mask 216 222, the hard mask 216, the channel layers 208, and the inner spacer features 224.

Figure 15:
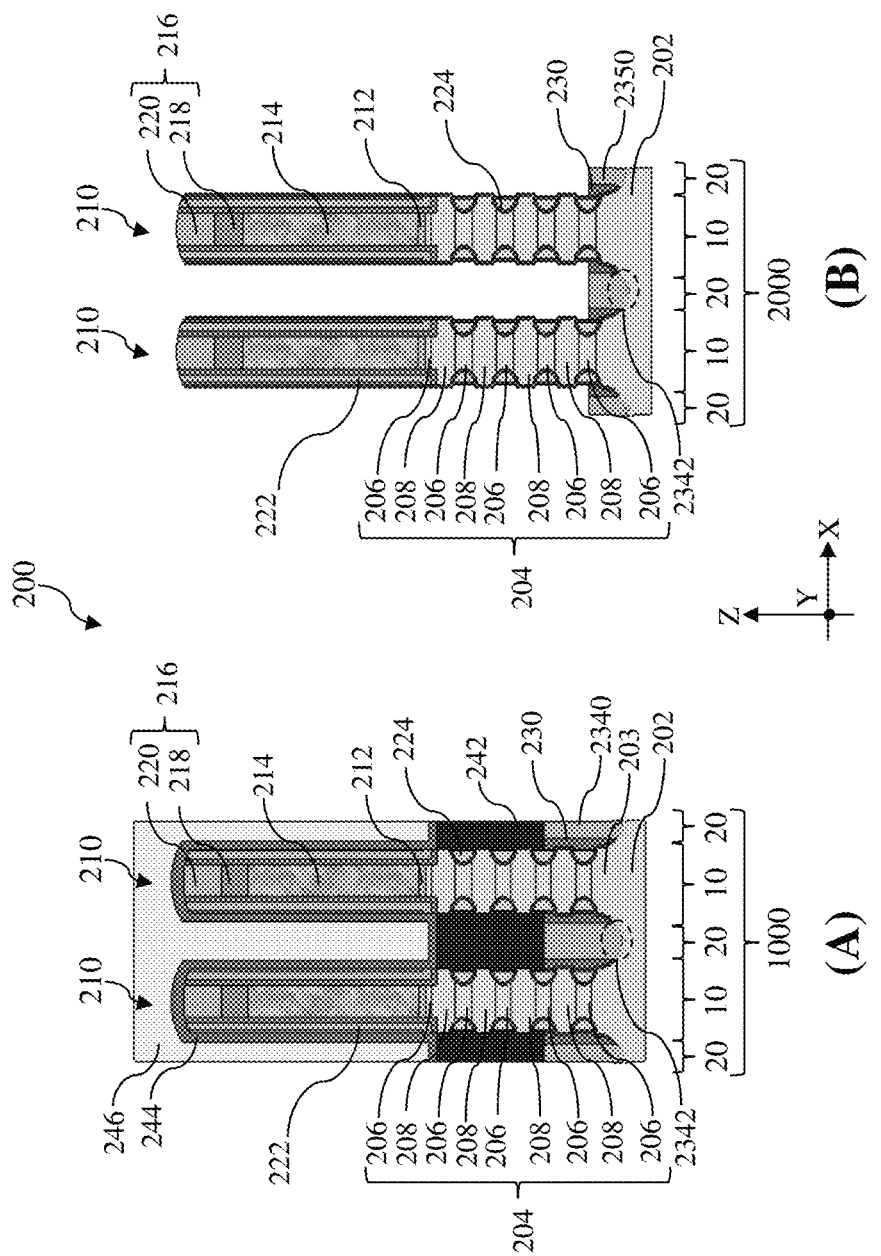
Figure 16:
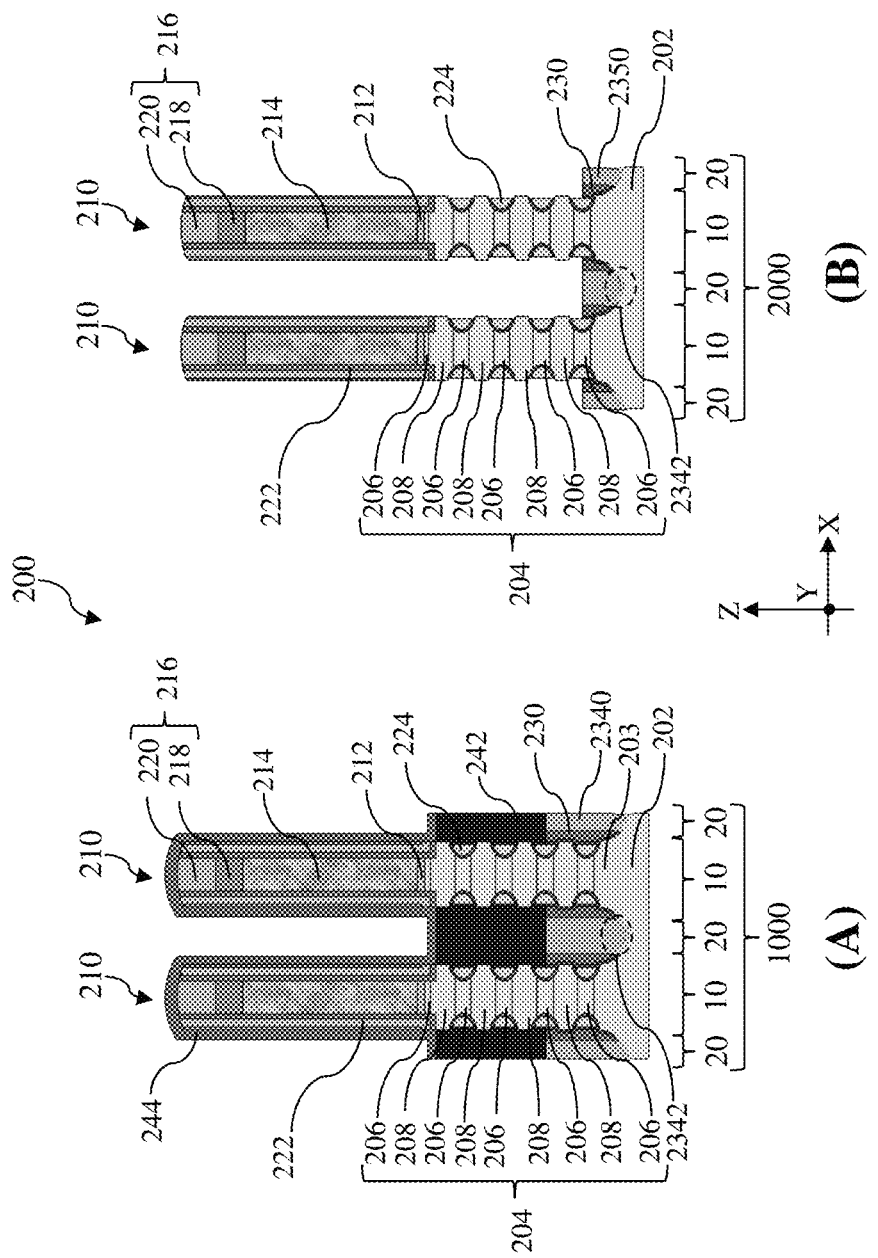

Referring to FIGS. 1, 15 and 16, method 100 includes a block 132 where the third blocking layer 244 in the second area 2000 are selectively removed. As shown in FIG. 15, in order to selectively remove the third blocking layer 244 in the second area 2000, a third bottom anti-reflective coating (BARC) layer 246 may be used to mask the first area 1000. To form the BARC mask over the first area 1000, a BARC material layer may be blanketly deposited over the workpiece 200 and photolithography techniques may be used to pattern the BARC material layer into the third BARC layer 246 over the first area 1000. In an example process, a photoresist layer is deposited over the BARC material layer using spin-on coating. The photoresist layer is then pre-baked, exposed to a radiation source, post-baked, and developed in a developer solution to form a patterned photoresist layer. The blanket BARC material layer is etched using the patterned photoresist layer as an etch mask to form the third BARC layer 246. With the third BARC layer 246 masking the first area 1000, the third blocking layer 244 in the second area 2000 may be selectively removed to expose sidewalls (side surfaces) of the channel layers 208. Reference is now made to FIG. 16. After the removal of the third blocking layer 244 in the second area 2000, the third BARC layer 246 may be removed from the first area 1000.

Figure 17:
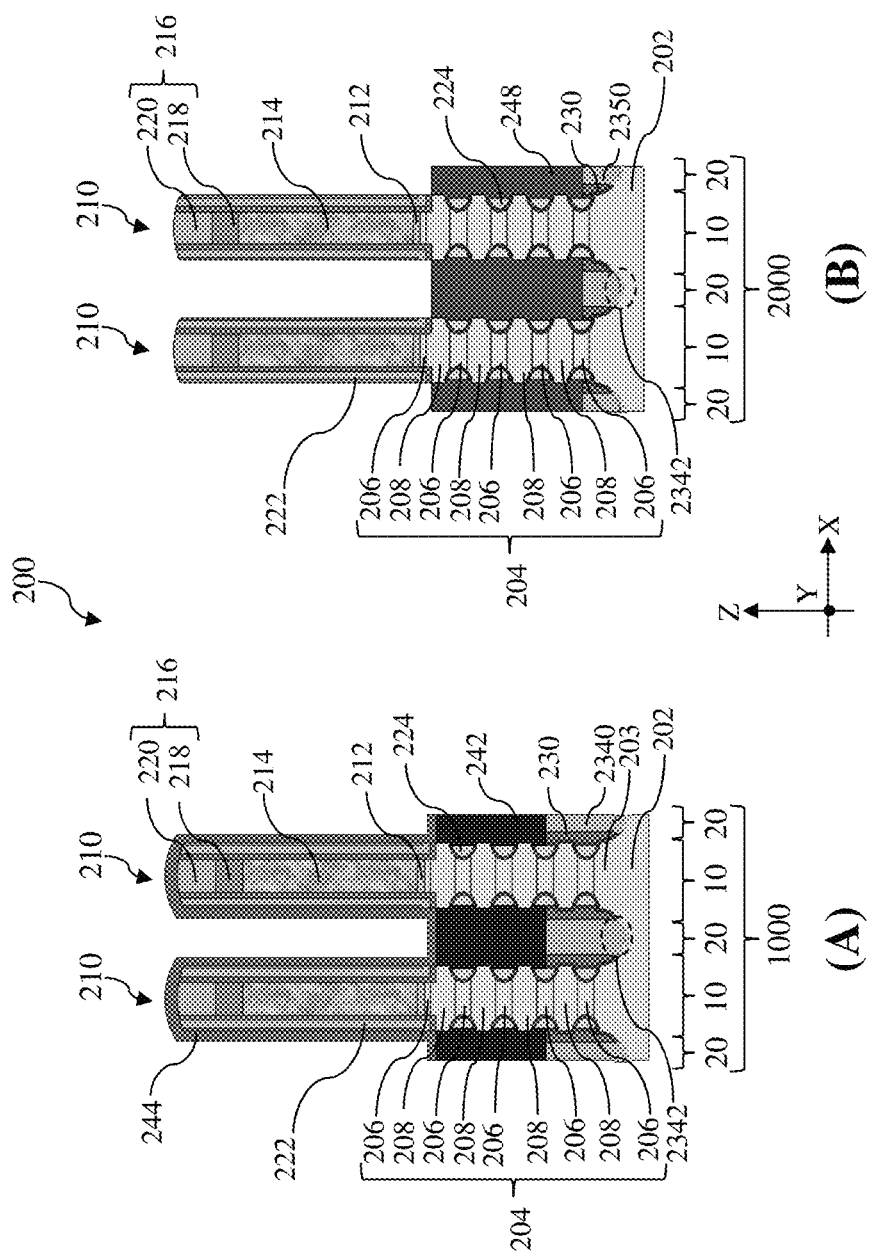

Referring to FIGS. 1 and 17, method 100 includes a block 134 where a second source/drain feature 248 are selectively deposited in the second area 2000. Suitable epitaxial processes for block 134 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the channel layers 208. In the embodiments represented in FIGS. 17A and 17B, the second source/drain features 248 in the second area 2000 are in direct contact with the channel layers 208. The second source/drain features 248 is spaced apart from the substrate 202 by the second semiconductor oxide feature 2350 and the first blocking layer 230 in the second area 2000. The second source/drain feature 248 grows from the channel layers 208 in the second area 2000 and does not grow on the third blocking layer 244 in the first area 1000. In addition, the second source/drain features 248 is also spaced apart from the sacrificial layers 206 by the inner spacer features 224. Depending on design needs, the second source/drain feature 248 may be n-type or p-type. When the second source/drain feature 248 is n-type, the second source/drain feature 248 may include Si, GaAs, GaAsP, SiP, or other suitable material. When the second source/drain feature 248 is p-type, the second source/drain feature 248 may include Si, Ge, AlGaAs, SiGe, boron-doped SiGe (SiGeB), or other suitable material. The second source/drain features 248 may be in-situ doped during the epitaxial process by introducing doping species including dopants. If the second source/drain feature 248 is not in-situ doped, an implantation process (i.e., a junction implant process) is performed to dope the second source/drain feature 248. In one embodiment, the second source/drain feature 248 is n-type and includes silicon (Si) and phosphorus (P).

Figure 18:
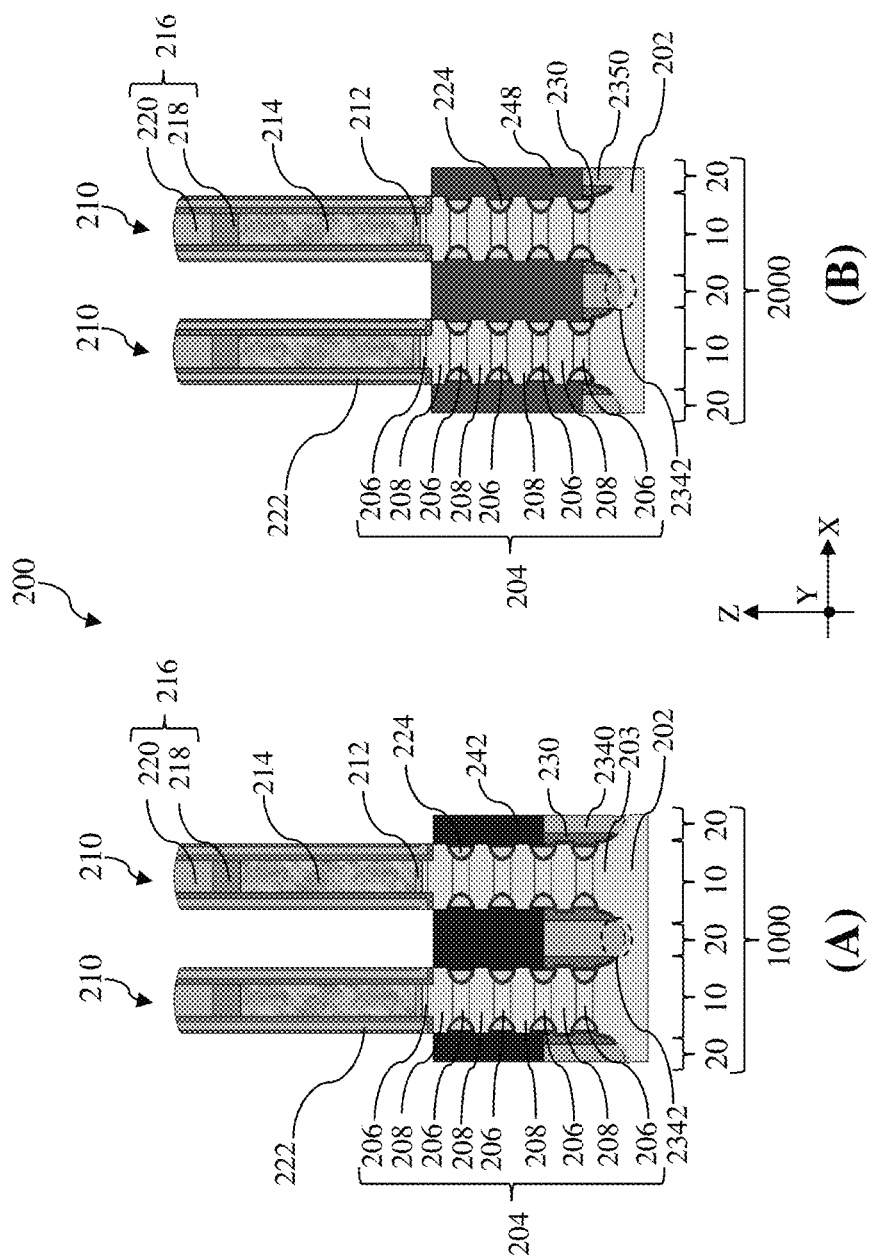

Referring to FIGS. 1 and 18, method 100 includes a block 136 where the third blocking layer 244 is removed. To prepare the workpiece 200 for further processes, the remaining third blocking layer 244 covering the first area 1000 (shown in FIG. 17) is removed. As shown in FIG. 18, after the operations at block 136, the gate spacer layer 222, the top surface of the hard mask 216, and top surfaces of the first source/drain feature 242 are exposed in the first area 1000; and the gate spacer layer 222, the top surface of the hard mask 216, and top surfaces of the second source/drain feature 248 are exposed in the second area 2000.

Figure 19:
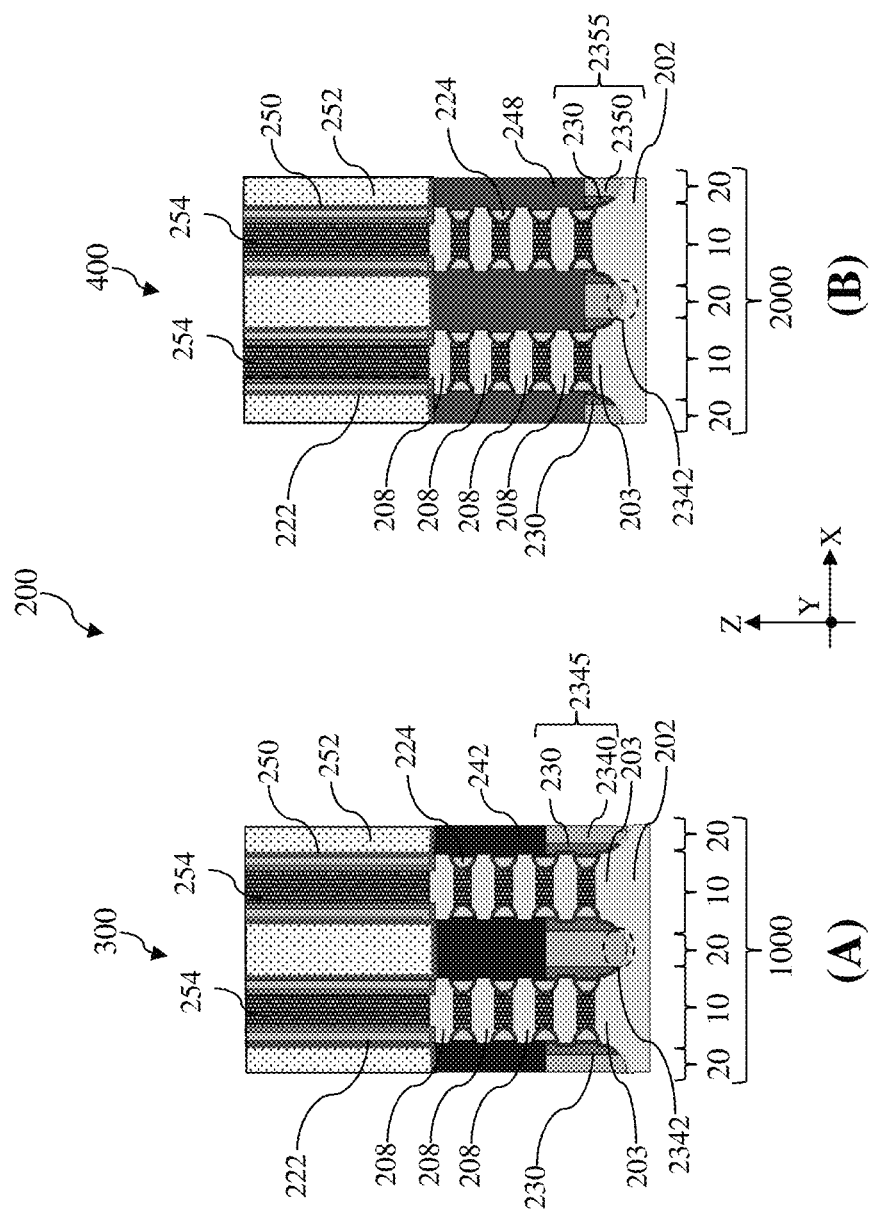

Referring to FIGS. 1 and 19, method 100 includes a block 138 where further processes are performed. As illustrated in FIG. 19 (including 19A and 19B), such further processes may include deposition of a contact etch stop layer (CESL)

250, deposition of an interlayer dielectric (ILD) layer 252, a planarization process to remove the hard mask 216, removal of the dummy gate electrode layer 214 and the dummy gate dielectric layer 212, release of the channel layers 208 to form channel members 208, formation of gate structures 254, and planarization of the workpiece 200. In some examples, the CESL 250 includes a silicon nitride layer, a silicon oxide layer, a silicon oxynitride layer, and/or other materials known in the art. The CESL 250 may be formed by ALD, plasma-enhanced chemical vapor deposition (PECVD) process and/or other suitable deposition or oxidation processes. The ILD layer 252 is then deposited over the CESL 250. In some embodiments, the ILD layer 252 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 252 may be deposited by a PECVD process or other suitable deposition technique. In some embodiments, after formation of the ILD layer 252, the workpiece 200 may be annealed to improve integrity of the ILD layer 252.

In some examples, after depositing the ILD layer 252, a planarization process may be performed to remove excessive dielectric materials. For example, a planarization process includes a chemical mechanical planarization (CMP) process which removes portions of the ILD layer 252 (and CESL 250, if present) overlying the dummy gate stacks 210 and planarizes a top surface of the workpiece 200. In some embodiments, the CMP process also removes hard mask 216 and exposes the dummy electrode layer 214. Exposure of the dummy electrode layer 214 allows the removal of the dummy electrode layer 214, removal of the dummy gate dielectric layer 212, and release of the channel layers 208.

In some embodiments, the removal of the dummy gate electrode layer 214 and the dummy gate dielectric layer 212 results in gate trenches over the channel regions 10 in the first area 1000 and the second area 2000. The removal of the dummy gate electrode layer 214 and the dummy gate dielectric layer 212 may include one or more etching processes that are selective to the materials in the dummy gate electrode layer 214 and the dummy gate dielectric layer 212. For example, the removal of the dummy gate electrode layer 214 and the dummy gate dielectric layer 212 may be performed using a selective wet etch, a selective dry etch, or a combination thereof that is selective to the dummy gate electrode layer 214 and the dummy gate dielectric layer 212. After the removal of the dummy gate electrode layer 214 and the dummy gate dielectric layer 212, sidewalls of the epitaxial layers 206 and 208 are exposed in the gate trench.

After the removal of the dummy gate electrode layer 214 and the dummy gate dielectric layer 212, the method 100 may include operations to selectively remove the sacrificial layers 206 between the channel layers 208 in the channel regions 10 in the first area 1000 and the second area 2000. The selective removal of the sacrificial layers 206 releases the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx removed by an etchant such as $NH_4OH$.

The method 100 may include further operations to form the gate structures 254. In some embodiments, the gate structures 254 are formed within the gate trenches over the workpiece 200 and are deposited in the space left behind by the removal of the sacrificial layers 206. In this regard, the gate structures 254 wraps around each of the channel members 208 in the first area 1000 and the second area 2000. In various embodiments, each of the gate structures 254 includes an interfacial layer, a high-K gate dielectric layer formed over the interfacial layer, and/or a gate electrode layer formed over the high-K gate dielectric layer. High-K gate dielectrics, as used and described herein, include dielectric materials having a high dielectric constant, for example, greater than that of thermal silicon oxide (~3.9). The gate electrode layer used within the gate structures 254 may include a metal, metal alloy, or metal silicide.

In some embodiments, the interfacial layer of the gate structures 254 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer of the gate structures 254 may include a high-K dielectric layer such as hafnium oxide. Alternatively, the high-K gate dielectric layer of the gate structures 254 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer of the gate structures 254 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of the gate structures 254 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the gate structures 254 may be formed by ALD, PVD, CVD, e-beam evaporation, or other suitable process. Further, the gate electrode layer may be formed separately for N-FET and P-FET transistors which may use different metal layers (e.g., for providing different n-type and p-type work function metal layers). In various embodiments, a CMP process may be performed to remove excessive metal from the gate electrode layer of the gate structures 254, and thereby provide a substantially planar top surface of the gate structures 254. The gate structures 254 include portions that interpose between neighboring channel members 208 in the channel regions 10.

At the conclusion of the operations at block 138, a first transistor 300 is formed in the first area 1000 of the workpiece 200 and a second transistor 400 is formed in the second area 2000 of the workpiece 200. Because each of the first transistor 300 and the second transistor 400 includes vertically stacked channel members 208, the first transistor 300 and the second transistor 400 are gate-all-around (GAA)

transistors. Depending on design needs, the first transistor 300 and the second transistor 400 may be of the same conductivity type or of different conductivity types. In one example, the first transistor 300 in the first area 1000 is a p-type device and the second transistor 400 in the second area 2000 is an n-type device. In embodiments where operations at block 120 is performed to implement different depths of the first semiconductor oxide feature 2340 in the first area 1000 and the second semiconductor oxide feature 2350 in the second area 2000, the first transistor 300 and the second transistor 400 may have different numbers of active/functional channel members 208. As shown in FIG. 19, the first semiconductor oxide feature 2340 and the first blocking layer 230 that lines the first semiconductor oxide feature 2340 may be collectively referred to as a first bottom dielectric feature 2345 and the second semiconductor oxide feature 2350 and the first blocking layer 230 that lines the second semiconductor oxide feature 2350 may be collectively referred to as a second bottom dielectric feature 2355. With respect to the first transistor 300, the first bottom dielectric feature 2345 insulates the bottom-most channel member 208 in the first area 1000 from the first source/drain feature 242, rendering the bottom-most channel member 208 of the first transistor 300 inactive/non-functional. With respect to the second transistor 400, the second bottom dielectric feature 2355 does not insulate the bottom-most channel member 208 from the second source/drain feature 248. As a result, the first transistor 300 has one less active channel member 208 than the second transistor 400. In some alternative embodiments not explicitly shown, the first epitaxial feature 234 formed at block 118 is formed to a depth such that it does not cover the bottom-most channel layer 208 and operations at block 120 is omitted. In these alternative embodiments, the bottom-most channel layers in the first area 1000 and the second area 2000 would not be covered by the semiconductor oxide layers and the first blocking layer 230 and the resultant first transistor 300 and second transistor 400 have the same number of active/functional channel members.

Although not intended to be limiting, one or more embodiments of the present disclosure provide benefits to a semiconductor device and the formation thereof. For example, semiconductor devices according to the present disclosure includes a bottom dielectric feature disposed below a source/drain feature. The bottom dielectric feature can prevent latch-up by insulating the source/drain feature from the underlying substrate. In addition, the bottom dielectric feature shuts down leakage path through the APT implantation region under the channel region. Further still, methods according to the present disclosure allow forming GAA transistors having different number of channel members on a single substrate. Due to the implementation of the bottom dielectric features, tap cells, guard-rings, or other latch-up prevention structures may be reduced or eliminated to provide more space for functional devices.

In one exemplary aspect, the present disclosure is directed to a semiconductor device. The semiconductor device includes an active region including a channel region and a source/drain region adjacent the channel region, a vertical stack of channel members over the channel region, a gate structure over and around the vertical stack of channel members, a bottom dielectric feature over the source/drain region, a source/drain feature over the bottom dielectric feature, and a germanium layer disposed between the bottom dielectric feature and the source/drain region.

In some embodiments, the bottom dielectric feature includes a silicon germanium oxide feature sandwiched between two dielectric spacer features. In some implementations, the two dielectric spacer features include silicon nitride. In some instances, the silicon germanium oxide feature is disposed directly on the germanium layer. In some embodiments, the vertical stack of channel members are separated partially by a plurality of inner spacer features. In some implementations, the two dielectric spacer features are in contact with at least one of the plurality of inner spacer features. In some instances, a bottom-most channel member of the vertical stack of channel members is in contact with the bottom dielectric feature.

In another exemplary aspect, the present disclosure is directed to a semiconductor device. The semiconductor device includes a substrate having a first area and a second area, a first transistor in the first area, and a second transistor in the second area. The first transistor includes a first active region including a first channel region and a first source/drain region adjacent the first channel region, a first vertical stack of channel members over the first channel region, a first gate structure over and around the first vertical stack of channel members, a first bottom dielectric feature over the first source/drain region, a first source/drain feature over the first bottom dielectric feature, and a first germanium layer disposed between the first bottom dielectric feature and the first source/drain region. The second transistor includes a second active region including a second channel region and a second source/drain region adjacent the second channel region, a second vertical stack of channel members over the second channel region, a second gate structure over and around the second vertical stack of channel members, a second bottom dielectric feature over the second source/drain region, a second source/drain feature over the second bottom dielectric feature, and a second germanium layer disposed between the second bottom dielectric feature and the second source/drain region. The first bottom dielectric feature has a first depth and the second bottom dielectric feature has a second depth smaller than the first depth.

In some embodiments, the first active region and the second active region include silicon, the first bottom dielectric feature includes a first silicon germanium oxide feature sandwiched between two first dielectric spacer features. The second bottom dielectric feature includes a second silicon germanium oxide feature sandwiched between two second dielectric spacer features. In some implementations, the two first dielectric spacer features and two second dielectric spacer features include silicon nitride. In some embodiments, the first silicon germanium oxide feature is disposed directly on the first germanium layer and the second silicon germanium oxide feature is disposed directly on the second germanium layer. In some implementations, the first vertical stack of channel members are separated partially by a first plurality of inner spacer features and the second vertical stack of channel members are separated partially by a second plurality of inner spacer features. In some instances, a bottom-most channel member of the first vertical stack of channel members is in contact with the first bottom dielectric feature and a bottom-most channel member of the second vertical stack of channel members is not in contact with the second bottom dielectric feature.

In yet another exemplary aspect, the present disclosure is directed to a method. The method includes forming on a substrate a stack including a plurality of semiconductor layers interleaved by a plurality of sacrificial layers, forming a fin structure from the stack, forming a dummy gate stack over the fin structure, depositing a gate spacer layer over the dummy gate stack, forming a source/drain recess adjacent the dummy gate stack, selectively and partially etching the plurality of sacrificial layers to form a plurality of inner spacer recesses, forming a plurality of inner spacer features in the plurality of inner spacer recesses, forming a dielectric layer over the substrate, removing a portion of the dielectric layer in the source/drain recess to expose a top-facing surface of the substrate, forming a bottom dielectric feature in the source/drain recess on the top-facing surface, and forming an epitaxial feature over the bottom dielectric feature.

In some embodiments, the forming of the bottom dielectric feature includes epitaxially depositing a silicon germanium layer on the top-facing surface, and annealing the silicon germanium layer to form a silicon germanium oxide feature. In some implementations, the silicon germanium layer includes between about 55% and about 80% of silicon and between about 20% and about 45% of germanium. In some instances, the forming of the bottom dielectric feature further includes after the epitaxially depositing the silicon germanium layer, pulling back the silicon germanium layer. In some embodiments, the annealing of the silicon germanium layer further includes forming a germanium layer between the top-facing surface and the silicon germanium oxide feature. In some implementations, the substrate includes silicon, the plurality of semiconductor layers includes silicon, and the plurality of sacrificial layers include silicon germanium. In some instances, the plurality of inner spacer features includes silicon oxide, silicon oxycarbide, or silicon carbonitride and the dielectric layer includes silicon nitride.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an active region including a channel region and a source/drain region adjacent the channel region;
   a vertical stack of channel members over the channel region;
   a gate structure over and around the vertical stack of channel members;
   a bottom dielectric feature over the source/drain region;
   a source/drain feature over the bottom dielectric feature; and
   a germanium layer disposed between the bottom dielectric feature and the source/drain region,
   wherein the bottom dielectric feature comprises a silicon germanium oxide feature sandwiched between two dielectric spacer features.

2. The semiconductor device of claim 1, where the two dielectric spacer features comprise silicon nitride.

3. The semiconductor device of claim 1, wherein the silicon germanium oxide feature is disposed directly on the germanium layer.

4. The semiconductor device of claim 1, wherein the vertical stack of channel members are separated partially by a plurality of inner spacer features.

5. The semiconductor device of claim 4, wherein the two dielectric spacer features are in contact with at least one of the plurality of inner spacer features.

6. The semiconductor device of claim 1, wherein a top surface of the bottom dielectric feature is higher than a bottom-most channel member of the vertical stack of channel members.

7. The semiconductor device of claim 6, wherein the bottom dielectric feature prevents the bottom-most channel member from coming in direct contact with the source/drain feature.

8. A semiconductor device, comprising:
   a substrate having a first area and a second area;
   a first transistor in the first area and comprising:
      a first active region including a first channel region and a first source/drain region adjacent the first channel region,
      a first vertical stack of channel members over the first channel region,
      a first gate structure over and around the first vertical stack of channel members,
      a first bottom dielectric feature over the first source/drain region,
      a first source/drain feature over the first bottom dielectric feature, and
      a first germanium layer disposed between the first bottom dielectric feature and the first source/drain region; and
   a second transistor in the second area and comprising:
      a second active region including a second channel region and a second source/drain region adjacent the second channel region,
      a second vertical stack of channel members over the second channel region,
      a second gate structure over and around the second vertical stack of channel members,
      a second bottom dielectric feature over the second source/drain region,
      a second source/drain feature over the second bottom dielectric feature, and
      a second germanium layer disposed between the second bottom dielectric feature and the second source/drain region,
   wherein the first bottom dielectric feature has a first depth and the second bottom dielectric feature has a second depth smaller than the first depth.

9. The semiconductor device of claim 8,
   wherein the first active region and the second active region comprise silicon,
   wherein the first bottom dielectric feature comprises a first silicon germanium oxide feature sandwiched between two first dielectric spacer features,
   wherein the second bottom dielectric feature comprises a second silicon germanium oxide feature sandwiched between two second dielectric spacer features.

10. The semiconductor device of claim 9, where the two first dielectric spacer features and two second dielectric spacer features comprise silicon nitride.

11. The semiconductor device of claim 9,
   wherein the first silicon germanium oxide feature is disposed directly on the first germanium layer,
   wherein the second silicon germanium oxide feature is disposed directly on the second germanium layer.

12. The semiconductor device of claim 9,
   wherein the first vertical stack of channel members are separated partially by a first plurality of inner spacer features, wherein the second vertical stack of channel members are separated partially by a second plurality of inner spacer features.

13. The semiconductor device of claim 12,
wherein a bottom-most channel member of the first vertical stack of channel members is in contact with the first bottom dielectric feature,
wherein a bottom-most channel member of the second vertical stack of channel members is not in contact with the second bottom dielectric feature.

14. A method, comprising:
forming on a substrate a stack comprising a plurality of semiconductor layers interleaved by a plurality of sacrificial layers;
forming a fin structure from the stack;
forming a dummy gate stack over the fin structure;
depositing a gate spacer layer over the dummy gate stack;
forming a source/drain recess adjacent the dummy gate stack;
selectively and partially etching the plurality of sacrificial layers to form a plurality of inner spacer recesses;
forming a plurality of inner spacer features in the plurality of inner spacer recesses;
forming a dielectric layer over the substrate;
removing a bottom portion of the dielectric layer in the source/drain recess to expose a top-facing surface of the substrate while a sidewall portion of the dielectric layer extends along sidewalls of the source/drain recess;
forming a bottom dielectric feature in the source/drain recess on the top-facing surface wherein a top surface of the bottom dielectric feature is higher than a bottom-most semiconductor layer in the fin structure; and
forming an epitaxial feature over the bottom dielectric feature.

15. The method of claim 14, wherein the forming of the bottom dielectric feature comprises:
epitaxially depositing a silicon germanium layer on the top-facing surface and in contact with the sidewall portion of the dielectric layer;
annealing the silicon germanium layer to form a silicon germanium oxide feature; and
removing a portion of the sidewall portion of the dielectric layer.

16. The method of claim 15, wherein the silicon germanium layer comprises between about 55% and about 80% of silicon and between about 20% and about 45% of germanium.

17. The method of claim 15, wherein the forming of the bottom dielectric feature further comprises:
after the epitaxially depositing the silicon germanium layer, pulling back the silicon germanium layer.

18. The method of claim 15, wherein the annealing of the silicon germanium layer further comprises forming a germanium layer between the top-facing surface and the silicon germanium oxide feature.

19. The method of claim 14, wherein the substrate comprises silicon, the plurality of semiconductor layers comprise silicon, and the plurality of sacrificial layers comprise silicon germanium.

20. The method of claim 14,
wherein the plurality of inner spacer features comprises silicon oxide, silicon oxycarbide, or silicon carbonitride,
wherein the dielectric layer comprises silicon nitride.

* * * * *